United States Patent
Diamant

(10) Patent No.: US 11,334,358 B2
(45) Date of Patent: May 17, 2022

(54) HARDWARE ACCELERATOR HAVING RECONFIGURABLE INSTRUCTION SET AND RECONFIGURABLE DECODER

(71) Applicant: Amazon Technologies, Inc., Seattle, WA (US)

(72) Inventor: Ron Diamant, Santa Clara, CA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/707,857

(22) Filed: Dec. 9, 2019

(65) Prior Publication Data
US 2021/0173656 A1    Jun. 10, 2021

(51) Int. Cl.
*G06F 9/30* (2018.01)
*G06F 9/38* (2018.01)
(Continued)

(52) U.S. Cl.
CPC .......... *G06F 9/3836* (2013.01); *G06F 9/3016* (2013.01); *G06F 9/30145* (2013.01);
(Continued)

(58) Field of Classification Search
CPC ............... G06F 9/30145; G06F 9/3016; G06F 9/30196; G06F 9/3818
See application file for complete search history.

(56) References Cited

U.S. PATENT DOCUMENTS 4,187,539 A * 2/1980 Eaton ................... G06F 9/3867
712/211
5,019,965 A 5/1991 Webb, Jr. et al.
(Continued)

FOREIGN PATENT DOCUMENTS

| CN | 1929603 | 3/2007 |
|---|---|---|
| TW | 202113630 | 4/2021 |

(Continued)

OTHER PUBLICATIONS

U.S. Appl. No. 16/707,893, "Instructions With Multiple Memory Access Modes," filed Dec. 9, 2019, 82 pages.
(Continued)

*Primary Examiner* — Jacob Petranek
(74) *Attorney, Agent, or Firm* — Kilpatrick Townsend & Townsend LLP

(57) ABSTRACT

In one example, a hardware accelerator comprises: a programmable hardware instruction decoder programmed to store a plurality of opcodes; a programmable instruction schema mapping table implemented as a content addressable memory (CAM) and programmed to map the plurality of opcodes to a plurality of definitions of operands in a plurality of instructions; a hardware execution engine; and a controller configured to: receive an instruction that includes a first opcode of the plurality of opcodes; control the hardware instruction decoder to extract the first opcode from the instruction; obtain, from the instruction schema mapping table and based on the first opcode, a first definition of a first operand; and forward the instruction and the first definition to the hardware execution engine to control the hardware execution engine to extract the first operand from the instruction based on the first definition, and execute the instruction based on the first operand.

24 Claims, 22 Drawing Sheets

(51) Int. Cl.
*G06N 3/04* (2006.01)
*G06N 3/063* (2006.01)
*G11C 15/04* (2006.01)

(52) U.S. Cl.
CPC ........ *G06F 9/30196* (2013.01); *G06F 9/3824* (2013.01); *G06N 3/0454* (2013.01); *G06N 3/063* (2013.01); *G11C 15/04* (2013.01)

(56) References Cited

U.S. PATENT DOCUMENTS

| | | | |
|---|---|---|---|
| 6,049,862 | A | 4/2000 | Bauer et al. |
| 7,590,823 | B1* | 9/2009 | Ansari ................ G06F 9/30145 712/200 |
| 7,941,641 | B1 | 5/2011 | Jung |
| 10,338,919 | B2 | 7/2019 | Boswell et al. |
| 10,754,649 | B2 | 8/2020 | Bainville et al. |
| 2004/0156547 | A1* | 8/2004 | Kloth ..................... G06T 1/20 382/181 |
| 2011/0047439 | A1* | 2/2011 | Jorda .................... H03M 13/09 714/763 |
| 2011/0320825 | A1 | 12/2011 | Greiner et al. |
| 2015/0178076 | A1* | 6/2015 | Sudhakar .............. G06F 9/3016 712/210 |
| 2019/0258920 | A1 | 8/2019 | Lie et al. |
| 2019/0391811 | A1* | 12/2019 | Garegrat ................ G06F 17/16 |
| 2020/0034145 | A1 | 1/2020 | Bainville et al. |
| 2020/0184001 | A1* | 6/2020 | Gu ..................... G06F 12/0207 |

FOREIGN PATENT DOCUMENTS

| | | |
|---|---|---|
| WO | 2018193363 | 10/2018 |
| WO | 2019057281 | 3/2019 |

OTHER PUBLICATIONS

ColinMackenzie.net, "Your First CPU Chapter 1—Basic CPU—YFCPU Source Code," Available online at http://colinmackenzie.net/index.php?option=com_content&view=article&id=16%3Ayour-first-cpu-chapter-1-basic-cpu&catid=12%3Ayfcpu&Itemid=6&limitstart=2, May 16, 2010, 3 pages.

WO Application No. PCT/US2020/063085, International Search Report and Written Opinion, dated Apr. 13, 2021, 13 pages.

Telesens, "Understanding Matrix Multiplication on a Weight-Stationary Systolic Architecture," Available online at: https://www.telesens.co/2018/07/30/systolic-architectures/, Jul. 30, 2018, 17 pages.

Ross, "Under The Hood of Neural Network Forward Propagation-The Dreaded Matrix Multiplication," Sep. 9, 2017, 14 pages.

* cited by examiner

600

Opcode_1

Input_data_type: Bit_offset(5), Bit_length(10)

Step_x: Bit_offset(16), Bit_length(6)

Num_element_x: Bit_offset(23), Bit_length(6)

Step_y: Bit_offset(30), Bit_length(6)

Num_element_y: Bit_offset(37), Bit_length(6)

Step_z: Bit_offset(44), Bit_length(6)

Num_element_z: Bit_offset(51), Bit_length(6)

• • •

602

Instruction X definition

Opcode: Opcode_1

Operand_type_0: Input_data_type

Operand_type_1: Mem_access_3D

• • •

Operand_type_1 definition:
Operand_type_2: Step_x
Operand_type_3: Num_element_x
Operand_type_2: Step_y
Operand_type_3: Num_element_y
Operand_type_2: Step_z
Operand_type_3: Num_element_z

Opcode_2

Input_data_type: Bit_offset(5), Bit_length(10)

Step_x: Bit_offset(16), Bit_length(6)

Num_element_x: Bit_offset(23), Bit_length(6)

Step_y: Bit_offset(30), Bit_length(6)

Num_element_y: Bit_offset(37), Bit_length(6)

Step_z: Bit_offset(44), Bit_length(6)

Num_element_z: Bit_offset(51), Bit_length(6)

Step_t: Bit_offset(58), Bit_length(6)

Num_element_t: Bit_offset(65), Bit_length(6)

. . .

702

Instruction Y definition

Opcode: Opcode_2

Operand_type_0: Input_data_type

Operand_type_1: Mem_access_4D — 722

. . .

Operand_type_1 definition:
Operand_type_2: Step_x
Operand_type_3: Num_element_x
Operand_type_2: Step_y
Operand_type_3: Num_element_y
Operand_type_2: Step_z
Operand_type_3: Num_element_z
Operand_type_2: Step_t
Operand_type_3: Num_element_t

FIG. 7A

HARDWARE ACCELERATOR HAVING RECONFIGURABLE INSTRUCTION SET AND RECONFIGURABLE DECODER

BACKGROUND

Artificial neural networks are computing systems with an architecture based on biological neural networks. Artificial neural networks can be trained, using training data, to learn about how to perform a certain computing task for an application.

A hardware accelerator, such as a neural network processor, can implement an artificial neural network by performing various operations associated with the artificial neural network. The operations may include, for example, computation operations, memory access operations, etc. A hardware accelerator typically includes hardware components that are specifically configured to perform and accelerate these operations. Typically, these hardware components are programmable by instructions to support, for example, different neural network topologies, different applications of a neural network, etc.

BRIEF DESCRIPTION OF THE DRAWINGS

Various embodiments in accordance with the present disclosure will be described with reference to the drawings, in which:

FIG. 6 illustrates various forms of instruction schema program, according to certain aspects of the present disclosure;

FIGS. 7A-7C illustrate examples of instructions of different memory access modes supported by the neural network processor of FIGS. 4A-4D, according to certain aspects of the present disclosure;

DETAILED DESCRIPTION

Figure 1:
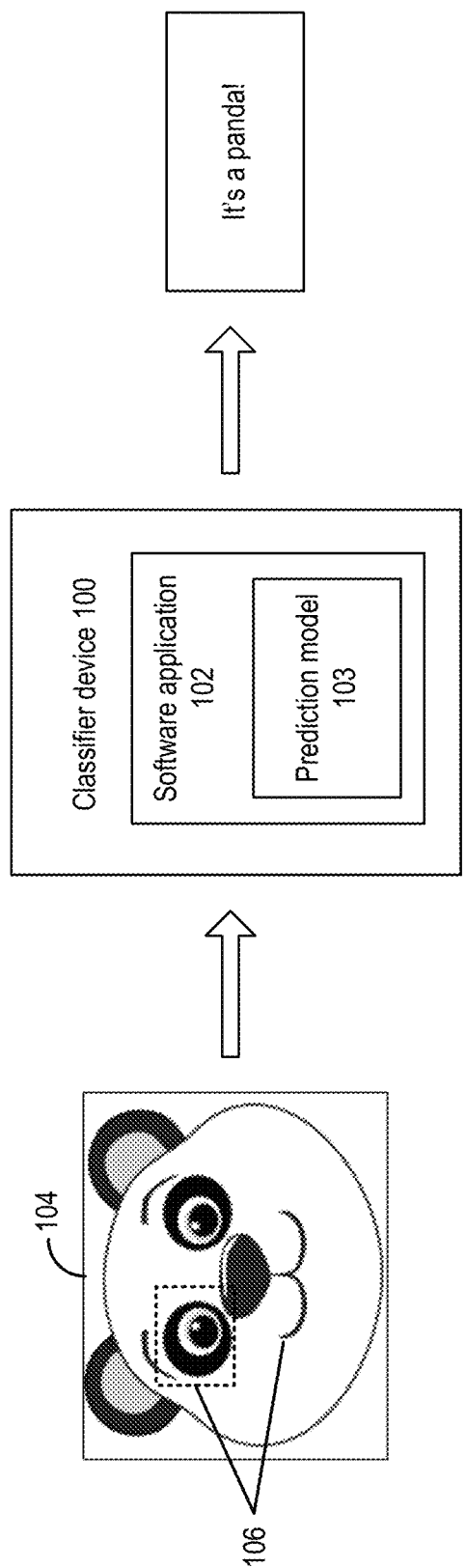
FIG. 1 illustrates an example a classifier device that uses techniques disclosed herein to process data.

Examples of the present disclosure relate to hardware accelerators, and more specifically, a neural network hardware accelerator having a reconfigurable instruction set.

A hardware accelerator, such as a neural network processor, can implement an artificial neural network by performing various operations associated with the artificial neural network. The operations may include computation operations such as, for example, convolution operations, post-processing operations such as pooling, activation function processing, etc., as well as memory access operations to support these computation operations. A hardware accelerator typically includes hardware components that are specifically configured to perform and/or accelerate these operations. For example, the hardware accelerator may include circuits specifically designed to perform certain arithmetic operations (e.g., convolution operations), circuits specifically designed to perform certain pooling operations, circuits specifically designed to perform certain activation function processing operations, circuits specifically designed to perform the memory access operations the computation operations, etc.

These hardware components typically are programmable by instructions to support different neural network topologies and/or for different applications of a neural network. The instructions may include, for example, indications of input data and weights to a convolution operation to be performed by the hardware accelerator, a selection of activation function and/or pooling operations, memory access operations to control the flow of data between different neural network layers, etc. The hardware components can extract this information from the instructions, and perform the operations based on the extracted information.

A set of instructions supported by the hardware components can form an instruction set. The instruction set also has a pre-defined instruction schema which defines the bit offsets and bit sizes of opcodes and various operands in each instruction of the instruction set. The opcode can define a specific operation to be performed (e.g., a convolution operation, an activation function processing, a pooling operation, a memory access operation, etc.), as well as operands for those operations (e.g., input data and weights, addresses to be accessed by the memory access operations, etc.). The hardware components can extract the opcodes and the operands from the instructions based on the pre-defined instruction schema, and perform the operations based on the extracted opcodes and operands.

The instructions in an instruction set can define a range of operations supported by the hardware accelerator, and the instruction set can define a range of neural network topologies and their applications supported by the hardware accelerator. However, as neural network topologies and their applications evolve, new operations may be needed to support these new topologies and applications. A hardware accelerator that only supports a fixed set of instructions may be unable to support those new operations, and cannot support the new neural network topologies and/or new applications.

Examples of the present disclosure relate to hardware accelerators, and more specifically, a neural network hardware accelerator having a reconfigurable instruction set. The neural network hardware accelerator includes a programmable hardware instruction decoder, a programmable instruction schema mapping table, a hardware execution engine, and a controller. The hardware instruction decoder can be programmed to store a first mapping between a plurality of opcodes and a plurality of definitions of bit lengths and bit offsets of the opcodes. The instruction schema mapping table can be programmed to store a second mapping between a plurality of opcodes and a plurality of definitions of bit offsets and bit lengths of operands of the instructions including the opcodes. The controller can forward a first instruction to each of the hardware instruction decoder and the execution engine. The hardware instruction decoder can find a first opcode from the first instruction based on the first mapping, and output the first opcode to the instruction schema mapping table. The instruction schema mapping table can output, based on the second mapping and the first opcode, a first definition of bite offsets and bit lengths of operands to the execution engine. The execution engine can extract a first operand from the first instruction based on the first definition, and perform an operation based on the first operand.

Both the hardware instruction decoder and the instruction schema mapping table can be programmed based on an instruction schema program. The instruction schema program can define an instruction set to be supported by the hardware accelerator and can define the bit offsets and bit lengths of an opcode and one or more operands of each instruction in the instruction set. The opcodes of the instruction set can have the same bit length or different bit lengths among the instructions. For example, some of the opcodes can have a bit length of one byte or less, whereas some of the opcodes can have a bit length of more than one byte. Moreover, some of the opcodes can span across two or more bytes of an instruction. Moreover, the bit offsets and bit lengths of the operands can also be different among the instructions. Such arrangements can provide flexibility in assigning opcodes and operands for different instructions to support different operations, which in turn can increase the number of instructions and operations supported by the hardware accelerator.

The definitions of opcodes and operands stored in the hardware instruction decoder and the instruction schema mapping table can correspond to an instruction set supported by the hardware accelerator. To enable the hardware accelerator to support operations not defined in the instruction set, the hardware instruction decoder and the instruction schema mapping table can be programmed according to a second instruction schema program to store a different definitions of opcodes and operands.

The hardware accelerator may include multiple execution engines to perform different types of operations of a neural network. The execution engines may include, for example, a systolic array to perform arithmetic operations to generate partial sums (e.g., of weight-data products), a summation buffer to accumulate the partial sums from the systolic array, a pooling engine to perform pooling operations, an activation function engine to perform activation function processing operations, etc. Based on the opcode, the hardware accelerator can route an instruction as well as the definition of operands to a target execution engine, which can then extract the operands from the instruction and perform a computation operation based on the operands. The operands may indicate, for example, a configuration of the arithmetic operations (e.g., a type of the input data, a precision of the arithmetic operation, etc.), a configuration of a post-processing operation (e.g., a selection of a pooling operation, a selection of an activation function, etc.), or other configurations. The definitions of opcodes and operands stored in the hardware instruction decoder and the instruction schema mapping table can thus define a range of arithmetic operations configurations and a range of post-processing operations supported by the hardware accelerator.

The hardware accelerator may also include an on-chip memory to provide temporary data storage for the execution engines. Each execution engine can be assigned a memory access circuit to access the memory. The memory access circuit can perform memory access operations based on the instruction received by the execution engine. The instruction can include operands which indicate a computation operation to be performed by the execution engine, as well as a specific memory access mode which defines a particular sequence of memory access operations to be performed by the memory controller of the execution engine to support the computation operation. The sequence of memory access operations may include, for example, accessing input data stored in the memory to create a stream of input data for the systolic array, the activation function engine, and/or the pooling engine, to store the output data from the systolic array, the activation engine, and/or the pooling engine at the memory, etc.

The memory access circuit of the hardware accelerator can support different sequences of memory access operations for different computation operations. For example, the memory access circuit can be programmed by the instructions to read input data organized into a tensor of a particular dimensionality (e.g., one dimensional vector, multi-dimensional matrices, etc.), and provide the data to the systolic array to perform a convolution operation. Depending on the dimensionality of the input data, the instruction may include operands for a single dimension, or for each of the multiple dimensions. The operands may include, for example, a step parameter based on a stride of the convolution operation, a number of elements parameter to define a number of input data elements to be fetched/provided to the systolic array, etc. In a case where the systolic array is to perform convolution operation on multi-dimensional input data, the instruction may include operands that define a step size and a number of elements for each dimension of the multiple dimensions. The memory access circuit can be designed to handle memory access operations up to a certain maximum dimensionality (e.g., 4D). The instructions can include operands for up to that maximum dimensionality, or a lower dimensionality (e.g., 1D, 2D, 3D, etc.), to control the memory access circuit to fetch/provide input data to the systolic array according to the dimensionality of the input data.

In addition, the memory access circuit can be programmed by the instructions to perform a write operation to the memory only when a pre-determined condition is satisfied. For example, the computation operation may include summation of data elements of a particular dimension of the tensor as part of a tensor reduction operation to compute the sum of data elements across dimensions of a tensor. An instruction may define that the memory access circuit of the summation buffer is to write the sum of the data elements of the vector/matrix to the memory. Another instruction may define that the memory access circuit is to write each partial sum received from the systolic array to the memory as part of an accumulation operation.

The dimensionality of input data to be read from the memory, as well as the conditions for storing output data in the memory, can be defined in a particular instruction set for a particular neural network/application. The hardware instruction decoder and the instruction schema mapping table can be programmed based on a first instruction schema program to support memory access operations for input data of a particular dimensionality (e.g., 1D) and/or for a particular condition of storing output data (e.g., storing only the sum of the 1D vector), for a particular neural network and/or a particular application. The hardware instruction decoder and the instruction schema mapping table can then be programmed based on a second instruction schema program to support memory access operations for input data of a different dimensionality (e.g., 2D, 3D, 4D, etc.) and/or for a different condition of storing output data (e.g., storing different partial sums as part of an accumulation operation), for a different neural network and/or a different application.

Examples of the present disclosure can increase the number of instructions supported by a hardware accelerator.

Specifically, the instructions supported by the hardware accelerator are no longer limited to the definitions of those instructions currently stored in the hardware instruction decoder and the instruction schema mapping table, and can be expanded by programming the hardware instruction decoder and the instruction schema mapping table with a different instruction schema program. Together with the flexibility of the opcodes and operands having variable bit lengths and/or bit offsets, as well as the capability of selecting different memory access modes, the capability of the hardware accelerator can thus be expanded to enable the hardware accelerator to support new operations associated with new neural network topologies and/or new applications. This capability can be expanded without changing the design of the accelerator.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

FIG. 1 illustrates an example classifier device 100 that uses techniques disclosed herein to process data. Classifier device 100 can be, for example, a computing device operating a software application 102 and a prediction model 103 to predict information included in a data sequence, and perform a predetermined function based on the prediction. For example, classifier device 100 can be part of an image recognition service provided to identify certain objects (e.g., text, a person, etc.) from an image. It is understood that the image recognition service is merely provided as an illustrative example, and that techniques disclosed herein can be used for other data processing applications including, for example, text-based data processing (e.g., processing of search queries), audio data processing, etc. Moreover, classifier device 100 may operate a number of different prediction models to process different input data, either in parallel or at different times.

In some examples, the image recognition service can be provided in a multi-tenant compute service system. The multi-tenant compute service system may typically include a plurality of servers that can host data and be used by multiple clients or organizations to run instances, such as virtual machine instances or bare-metal instances (e.g., operating systems that run directly on the server hardware). In most instances, such as bare-metal or virtual machine instances, a multi-tenant compute service system may be allocated to a client when the client needs them and decommissioned when they are no longer needed, such that the resources can be reallocated to other clients. In the present disclosure, the terms "tenant," "client," and "customer" may be used interchangeably, although such terms do not necessarily imply the existence of any particular business arrangement. The term "instance" may refer to, for example, an instance that is executed directly on server hardware or as a virtual machine. Different types of instances generally correspond to different hardware functions and/or arrangements of hardware (e.g., different amounts of available memory and/or processing hardware). In the example of FIG. 1, the multi-tenant compute service system may provide the image recognition service when the client needs it, and the service is decommissioned when it is no longer needed, such that the resources supporting the image recognition service (e.g., access to software application 102, and the underlying hardware resources for processing software application 102) can be reallocated to other clients. Different clients (or one client) may request application 102 to perform processing of different input data using the same or different prediction models including prediction model 103.

In the example of FIG. 1, software application 102 can receive pixel data of an image 104 from a user. Image 104 may include an array of pixels. Software application 102 can perform analysis on the pixel data, and predict one or more objects 106 depicted in image 104. The analysis may include, for example, comparing the pixel data against a set of predetermined features data. The predetermined features data may include data associated with a set of predetermined visual image features such as, for example, a nose object, a mouth object, etc. The predetermined features data may also include data associated with non-visual image features, or a combination of visual and non-visual image features. As to be discussed in more detail below, software application 102 may employ prediction model 103 to compute a set of scores based on the pixel data of image 104. The set of scores may represent, for example, the likelihood of image 104 including the image features represented by the features data. Software application 102 can then determine other information about the content of image 104 based on the scores. For example, based on the scores, software application 102 can determine that image 104 is an image of, for example, a panda, a cat, or other objects.

Figure 2A:
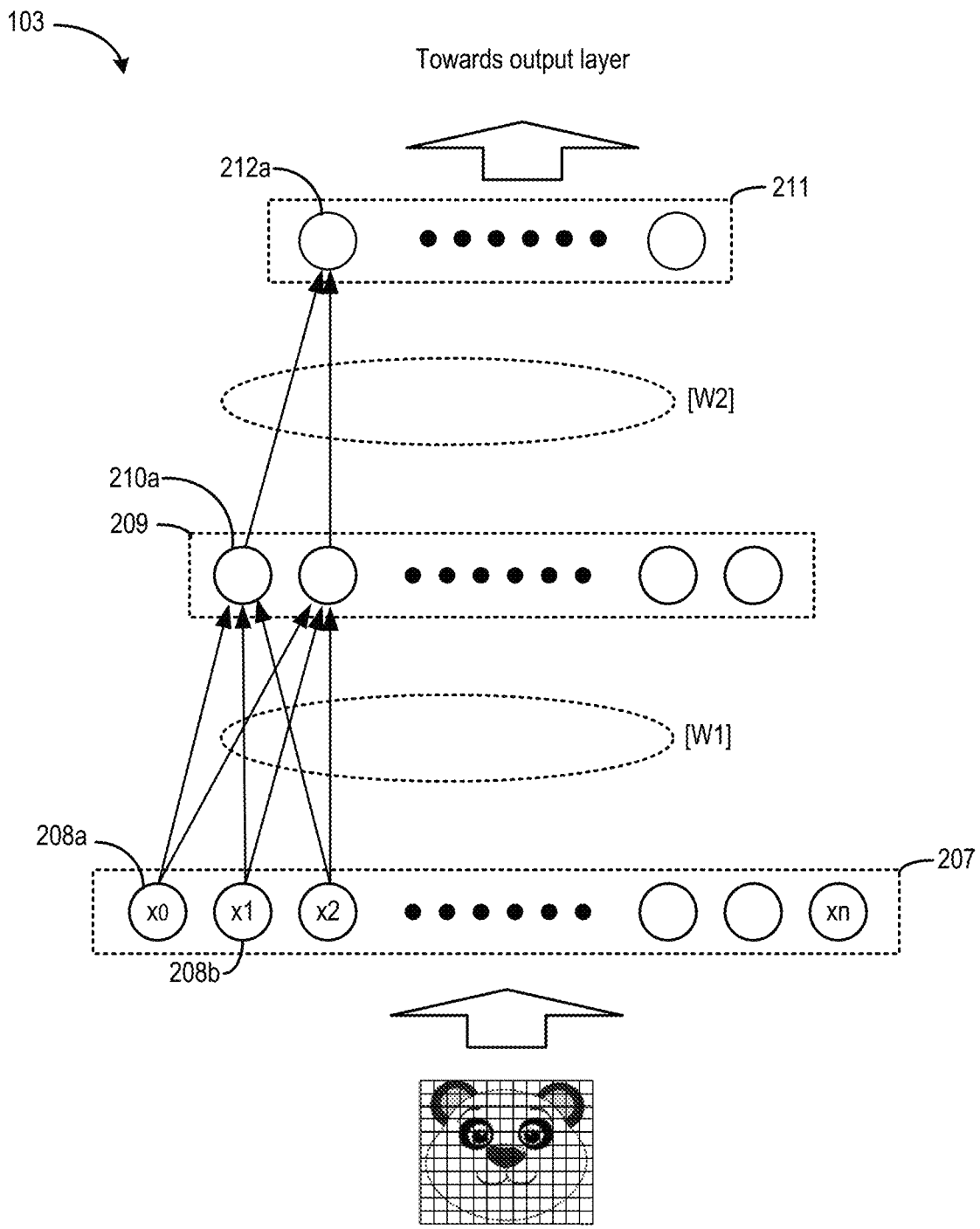
FIGS. 2A-2D are simplified block diagrams illustrating a prediction model and the computations that use techniques disclosed herein, according to certain aspects of the present disclosure.

Prediction model 103 can be in the form of an artificial neural network. The artificial neural network may include a plurality of processing nodes, with each processing node configured to process part of the input pixel data, or to further process the intermediate outputs from other processing nodes. FIG. 1 illustrates an example of prediction model 103 that uses techniques disclosed herein. In FIG. 1, prediction model 103 may be a multi-layer neural network such as a deep neural network (DNN), a convolutional neural network (CNN), etc. Prediction model 103 may include an input layer 207, a set of intermediate layers including intermediate layers 209 and 211, and an output layer (not shown in FIG. 2A). It is understood that prediction model 103 can also include other different types of neural networks including, for example, long short-term memory (LSTM), multilayer perception (MTP), multiscale densenet (MSD-NET), etc.

Layer 207 may process pixel data representing different portions of image 104. For example, in the example of FIG. 2A, layer 207 may process the pixel data of image 204. Each processing node of layer 207 is assigned to receive a pixel value (e.g., $x_0, x_1, x_2, \ldots x_n$) corresponding to a predetermined pixel within image 104, and transmit one or more weights with the received pixel value to layer 209. In a case where prediction model 203 is a DNN, each processing node of layer 207 can be assigned a set of weights defined based on a matrix W1. Each processing node of layer 207 can send the received pixel value and the assigned weights to each processing node of layer 209. In a case where prediction model 103 is a CNN, groups of the processing nodes of layer 207 may share a set of weights, and each group may send the set of weights and the pixel values received by the group of processing nodes to a single processing node of layer 209. Different neural network models may include different topologies (e.g., including a different number of layers, different connections between layers, etc.), and/or include a different set of weights for each layer.

Layer 209 may process the scaled outputs from layer 207 to generate a set of intermediate outputs. For example, assuming processing node 210a of layer 209 is connected to n processing nodes in layer 207, processing node 210a may generate a sum of the scaled outputs received from layer 207 based on the following equation:

$$\text{sum}_{210a} = \Sigma_{i=0}^{n}(W1_i \times x_i) \quad \text{(Equation 1)}$$

Here, $\text{sum}_{210a}$ represents an intermediate output generated by processing node 210a. $W1_i \times x_i$ represents a scaling of a particular pixel value (e.g., $x_0$) with the associated weight (e.g., $W1_0$) by a processing node of layer 207. In a case where prediction model 103 is a DNN, each processing node of layer 209 may generate the sum based on the scaling of pixel values from each processing node of layer 207, and then generate a sum (e.g., $\text{Sum}_{210a}$) by summing the scaled pixel values. The sum may also represent a dot-product between an input vector comprising a number of elements (e.g., pixel values) and a weight vector (e.g., W1). In some examples, a bias can also be added the scaled outputs to generate the intermediate output.

Figure 2B:
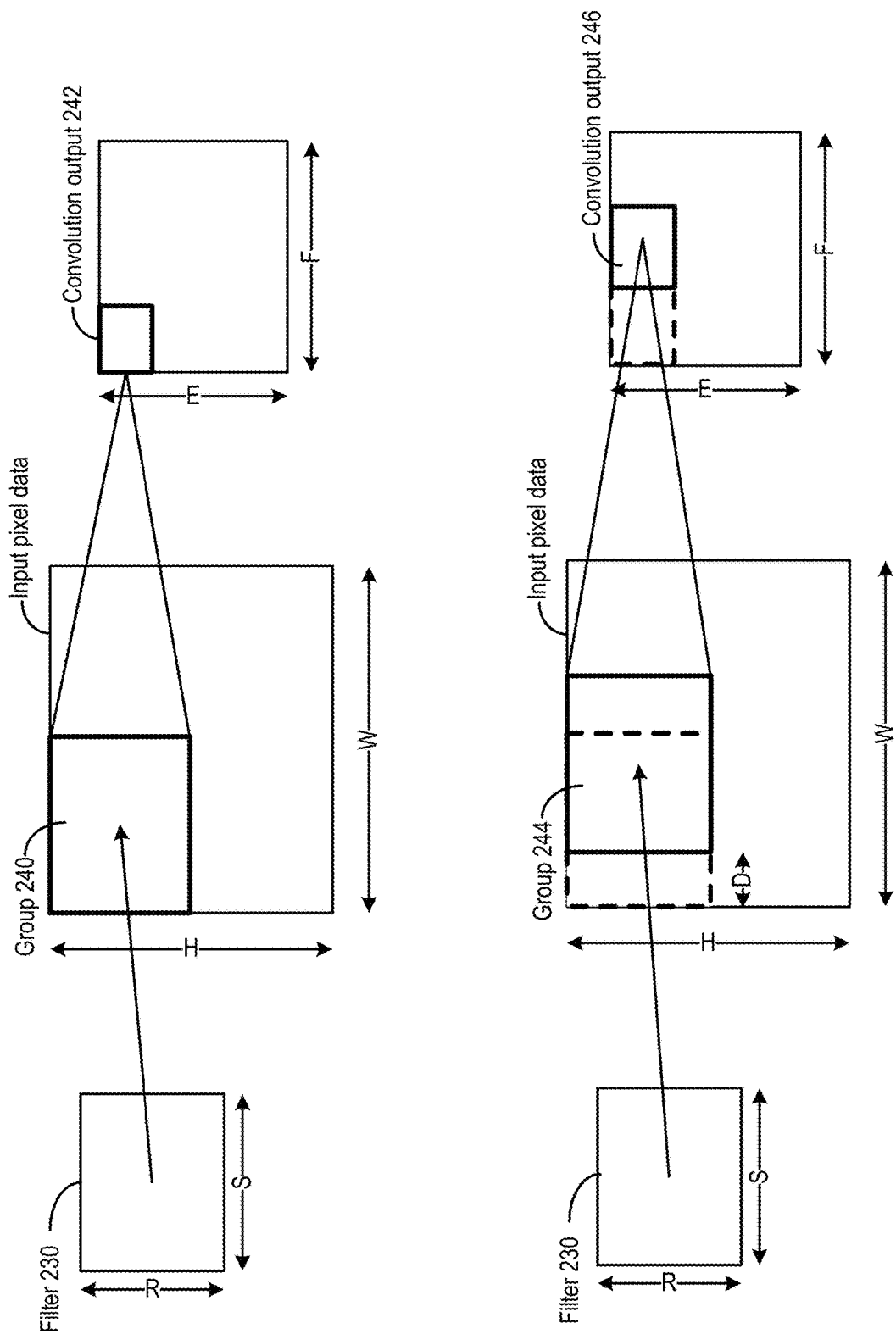

In a case where prediction model 103 is a CNN, each processing node of layer 209 may generate the intermediate output based on the scaling of pixel values from a group of processing nodes of layers 207. The intermediate output may represent a convolution result between a group of pixel values and a filter comprising the weight values. FIG. 2B illustrates an example of a convolution operation that layer 209 may perform. In FIG. 2B, filter 230 may include a two-dimensional array of weights. The weights in filter 230 may represent a spatial distribution of pixels for certain features to be detected from the image. The two-dimensional array may have a height of R rows and a width of S columns, and is typically smaller than an input image with a height of H pixels and a width of W pixels. Each weight may be mapped to a pixel in a rectangular block of pixel values with the same R rows and S columns. A processing node of layer 209 (e.g., processing node 210a) can receive, from a group of processing nodes of input layer 207, a group 240 of pixel values corresponding to a first rectangular block of pixels from the input image, which corresponds to a first stride location of filter 230, and generate a convolution output 242 based on a summation of multiplication results between each weight of filter 230 and each corresponding pixel in group 240 according to Equation 1, to generate a dot-product between a matrix represented by filter 230 and a matrix represented by group 240. Another processing node of layer 209 can also receive, from another group of processing nodes of input layer 207, a group 244 of pixel values corresponding to a second rectangular block of pixels from the input image corresponding to a second stride location of filter 230, and generate a convolution output 246 based on a summation of multiplication results between each weight of filter 230 and each corresponding pixel in group 244 according to Equation 1, to generate a dot-product between the matrix of filter 230 and a matrix represented by group 240. In some examples, each convolution output in FIG. 2B (e.g., convolution output 242, convolution output 346, etc.) can correspond to the output of a processing node of layer 209. In some examples, the pixel data in the input image may be referred to as an input feature map to indicate that the pixels are processed by the same filter (or same sets of filters) corresponding to certain feature(s). The convolution outputs may be referred to as an output feature map to indicate that the output is the result of processing an input feature map with the filter.

As shown in FIG. 2B, the convolution operations can be arranged in a sliding-window such that the second rectangular block overlaps, or is otherwise adjacent to, the first rectangular block in the input image. For example, in the example of FIG. 2B, D may be a distance of stride (in pixel) of the sliding-window for each convolution operation, such that the block of pixels corresponding to group 244 may be situated at a distance D (in terms of pixels) from the block of pixels corresponding to group 240, and the next block of pixels may also be situated at the same distance D from group 244. Other processing nodes of layer 209 may also receive groups of pixels corresponding to other rectangular blocks and generate other intermediate outputs. The convolution outputs can be part of a convolution output array. The array of convolution outputs can have a smaller height and a smaller width than the input image. Rectangular blocks of the convolution outputs can be further grouped, and convolution operations can be performed at layer 211 between the groups of convolution outputs and another set of filter weights to generate another set of convolution outputs.

Figure 2C:
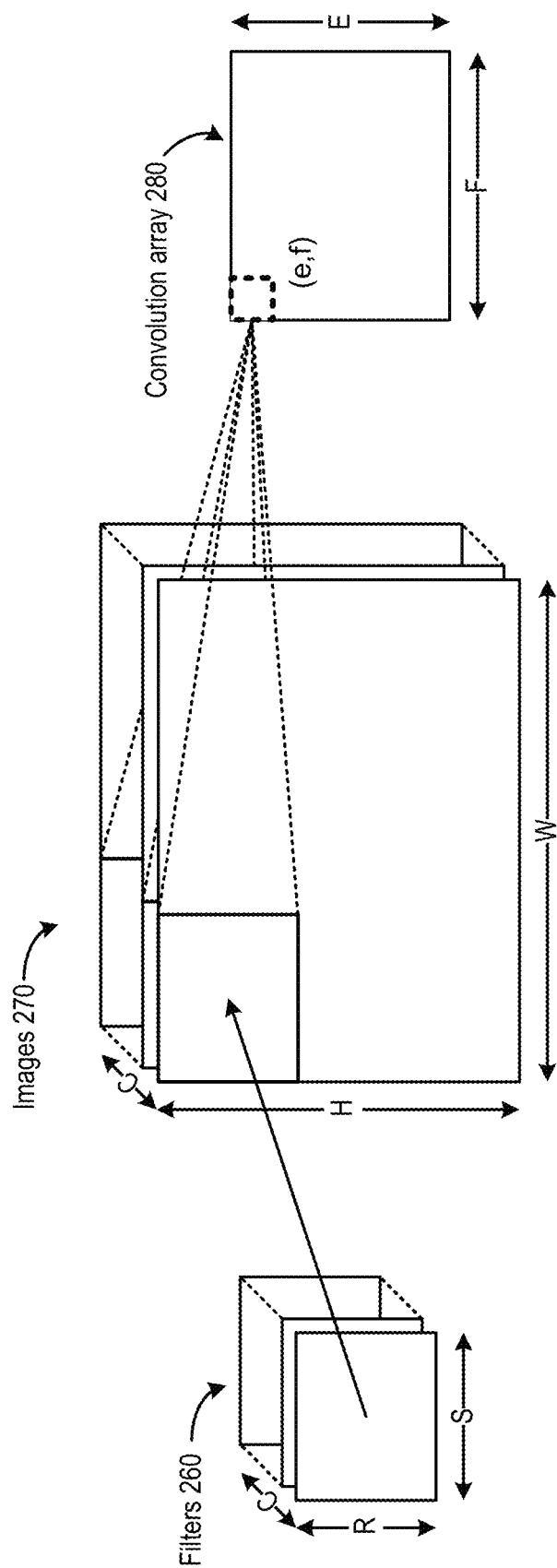

In some examples, the convolution operations can be performed between multiple images and multiple filters. For example, referring to FIG. 2C, a set of C filters 260 may corresponds to a number (C) of images 270, and convolution operations can be performed between each filter of the set of filters 260 and blocks of pixels on the corresponding image of images 270. Each of images 270 can corresponds to an input channel. The convolution results for each filter-image pair can be summed to generate a convolution output as follows:

$$O_{e,f} = \Sigma_{r=0}^{R-1} \Sigma_{s=0}^{S-1} \Sigma_{c=0}^{C-1} X^c_{eD+r, fD+s} \times W^c_{r,s} \quad \text{(Equation 2)}$$

Here, the convolution operation involves the images (or pixel arrays). $X^c_{eD+r, fD+s}$ may refer to the value of a pixel at an image of index c, within the number (C) of images 270, with a row coordinate of $eD+r$ and a column coordinate of $fD+s$. For the rest of the disclosure, the coordinates of element $X^c_{eD+r, fD+s}$ can be represented in the form of ($eD+r$, $fD+s$). The index c can denote a particular input channel. D is the sliding-window stride distance, whereas e and f correspond to the location of the data element in the convolution output array, which can also correspond to a particular sliding window. Further, r and s correspond to a particular location within the sliding window. A pixel at an (r, s) location and of an image of index c can also correspond to a weight $W^c_{r,s}$ in a corresponding filter of the same index c at the same (r, s) location. Equation 2 indicates that to compute a convolution output $O_{e,f}$, each pixel within a sliding window (indexed by (e,f)) may be multiplied with a corresponding weight $W^c_{r,s}$. A partial sum of the multiplication products within each sliding window for each of the image within the image set can be computed. And then a sum of the partial sums for all images of the image set can be computed.

Moreover, in some examples, multiple sets of filters can be used to perform convolution operations with a set of images to generate a set of convolution output arrays, with each convolution output array corresponding to a set of filters. Each set of filters can correspond to an output channel. For example, the multiple sets of filters may correspond to multiple features to be detected from the set of images, and each convolution output array may correspond to the detection results for each feature from the set of images. For example, where M sets of filters are applied to C images to generate M convolution output arrays, Equation 2 can be updated as follows:

$$O_{e,f}^m = \Sigma_{r=0}^{R-1} \Sigma_{s=0}^{S-1} \Sigma_{c=0}^{C-1} X^c_{eD+r, fD+s} \times W^{c,m}_{r,s} \quad \text{(Equation 3)}$$

Here, convolution output $O_{e,f}^m$ and weight $W^{c,m}_{r,s}$ has an index m corresponding to one of the M sets of filters. The index m can denote a particular output channel.

Figure 2D:
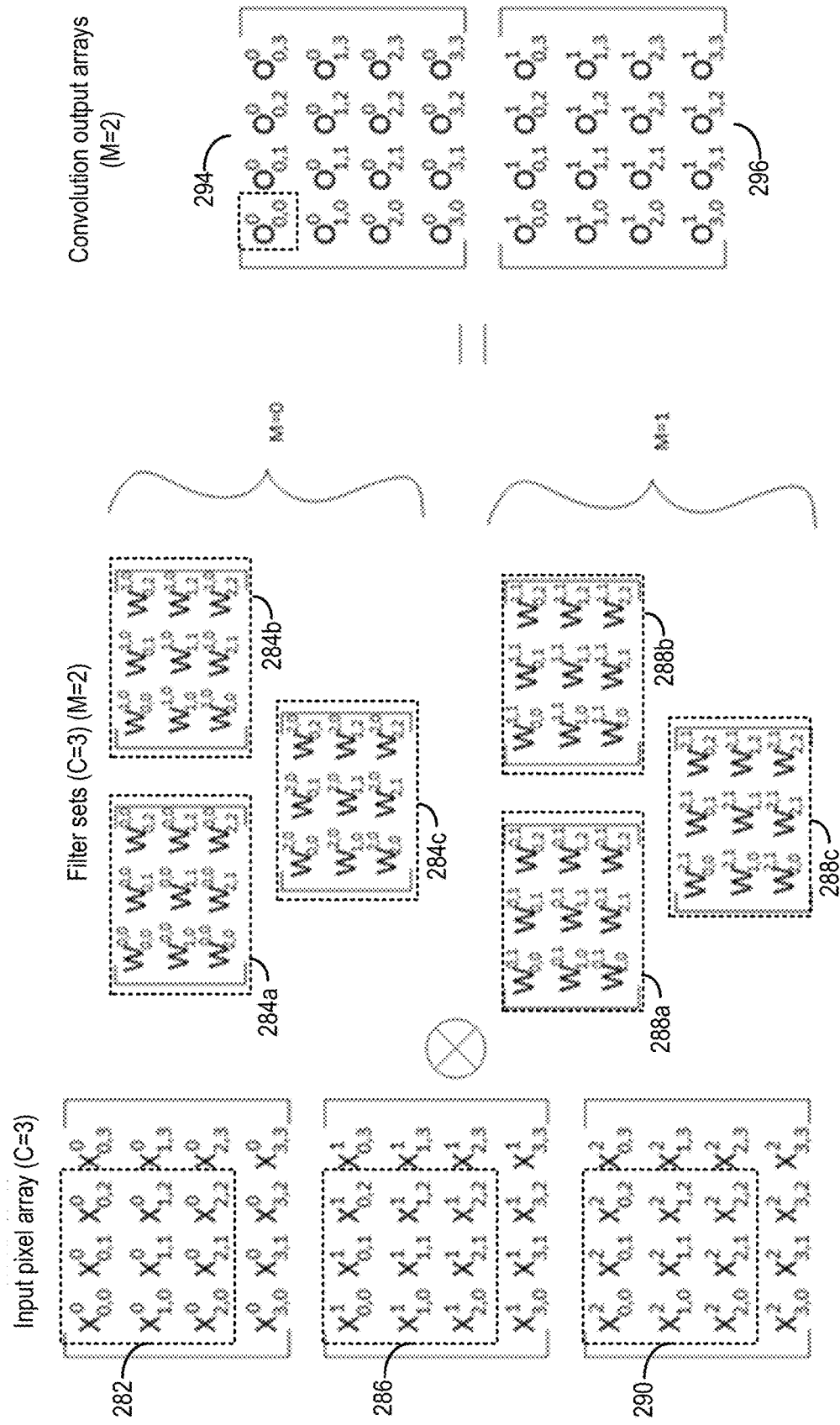

FIG. 2D illustrates an example of C sets of input data sets (with C=3) to be convolved with M sets of filters (with M=2). Each set of input data corresponds to the entries of a pixel array. Each of the M sets of filters includes a set of C filters which correspond to the C sets of input pixel arrays. The convolution operations generate M sets of output data elements, with each set of output data elements corresponding to a convolution output array. Each convolution output array corresponds to convolving one set (of the M sets) of filters with the input pixel arrays. For example, $O_{0,0}^0$ can be generated by a sum of the dot-product between group of pixels 282 and filter array 284, the dot-product between group of pixels 286 and filter array 288, and the dot-product between group of pixels 289 and filter array 292.

Referring back to FIG. 2A, one processing node of layer 209 may be configured to generate the convolution output elements of one convolution output array, and a set M of processing nodes of layer 209 can correspond to a set M of convolution output arrays. The processing node of layer 209 can also process each convolution output with an activation function to generate an activation output. The activation function may translate the convolution output into a decision of whether to forward the convolution output to intermediate layer 211 to influence the classifier decision (analogous to the firing of a biological neuron). An example of the activation function can be a rectified linear unit (ReLU) defined according to the following equation:

$$ReLU(x) = \begin{cases} x \text{ for } x \geq 0 \\ 0 \text{ for } x < 0 \end{cases} \quad \text{(Equation 4)}$$

In addition to ReLU, other forms of activation function can also be used including, for example, a softplus function (which can be a smooth approximation of a ReLU function), a hyperbolic tangent function (tan h), an arc tangent function (arctan), a sigmoid function, a Gaussian function, etc.

A processing node of layer 209 (e.g., processing node 210a) may process the sum with the ReLU function to generate a first output of layer 209 based on the following equation:

$$\text{first\_output}_{210a} = ReLU(Sum_{210a}) \quad \text{(Equation 5)}$$

Layer 211 may further process the scaled intermediate outputs from layer 209 by, for example performing additional convolution operations based on different sets of filters. The outputs from each processing node of layer 211 may be forwarded to other higher intermediate layers, or to an output layer (not shown in FIG. 2A). The output layer may form an output vector representing, for example, a probability that certain features are included in image 104, and/or a probability that image 204 includes an image of a panda. For example, the output vector may be compared against a reference vector associated with a nose object of a panda, or a reference vector associated with a panda. A decision about whether image 104 is an image of a panda can be determined based on the comparison result.

Figure 3:
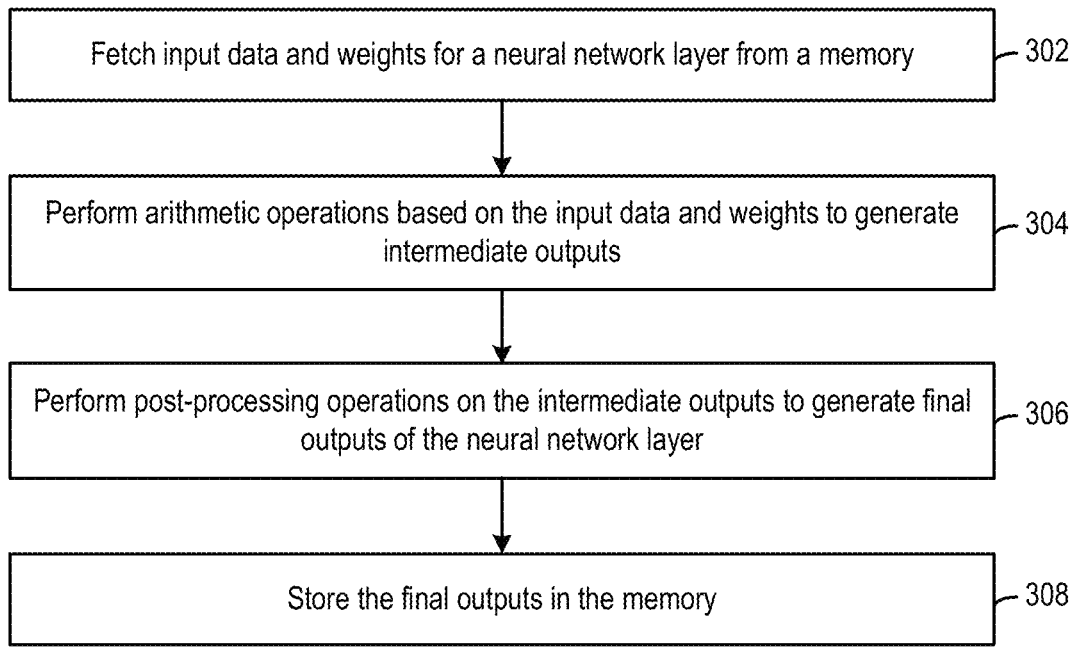
FIG. 3 illustrates an example sequence of neural network operations in a computing environment.

FIG. 3 illustrates an example sequence 300 of implementing a neural network operation in a computing environment. As shown in FIG. 3, sequence 300 can start with step 302, in which input data and weights for a neural network layer is fetched from a memory. The input data may include, for example, pixel values for an image, audio data, etc., or output data from the previous neural network layer. In step 304, arithmetic operations can be performed based on the input data and the weights to generate intermediate outputs. The arithmetic operations can include, for example, summations and multiplications as described above in Equations 1-3. The arithmetic operations can be performed by, for example, a systolic array of a hardware accelerator, a general purpose hardware processor, etc. In step 306, post-processing operations can be performed on the intermediate outputs to generate final outputs of the neural network layer. The post-processing operations may include, for example, pooling operations, activation function processing, etc., as described above in Equations 4 and 5. In step 308, the final outputs can be stored in the memory as the final output, which can represent the overall output of the neural network or as inputs to the next neural network layer.

Each of steps 302, 304, 306, and 308 can involve different operations for different neural network topologies and/or different applications. Specifically, in step 302, input data and weights organized into tensors of different dimensionalities (e.g., 1D, 2D, 3D, 4D, etc.), sizes, etc., may be fetched. For example, an audio processing application may access a one dimensional input data (e.g., a time-series of audio signals), whereas an image processing application may access multi-dimensional input data (e.g., two-dimensional images of different spectral channels). Moreover, the arithmetic operations in step 304 may vary. For example, a convolutional neural network (CNN) may implement a convolution operation as described in equations 3 and 4, while a fully connected neural network does not. Different convolution operations (e.g., a transposed convolution operation, a dilated convolution operation, etc.) may also be implemented. Further, other types of arithmetic operations may also be performed, such as a tensor reduction operation, to compute the sum of data elements across dimensions of a tensor. Different post-processing operations, such as different activation functions, different pooling operations, etc., can be implemented in step 306 for different neural network topologies and/or different applications. Lastly, the storage of output data in the memory in step 308 may involve different modes of write operations for different applications. For example, some applications may require the outputs to be written to the memory only after the arithmetic operations in step 304 completes, whereas some other applications may require partial sums to be written to and updated in the memory when the arithmetic operations in step 304 are in progress.

In the computing environment, each of steps 302, 304, 306, and 308 can be represented by one or more instructions to be executed to perform the neural network operation. The instructions may represent different operations for each of steps 302, 304, 306, and 308. For example, reading the memory for different dimensionalities and sizes of input data and weights may be represented by different instructions. Moreover, different instructions may represent different arithmetic operations in step 304, different post-processing operations in step 306, and different modes of write operations in step 308. To implement different neural network topologies for different applications, the computing environment may need to support a large number of instructions to cover the different operations in each of steps 302, 304, 306, and 308.

Figure 4A:
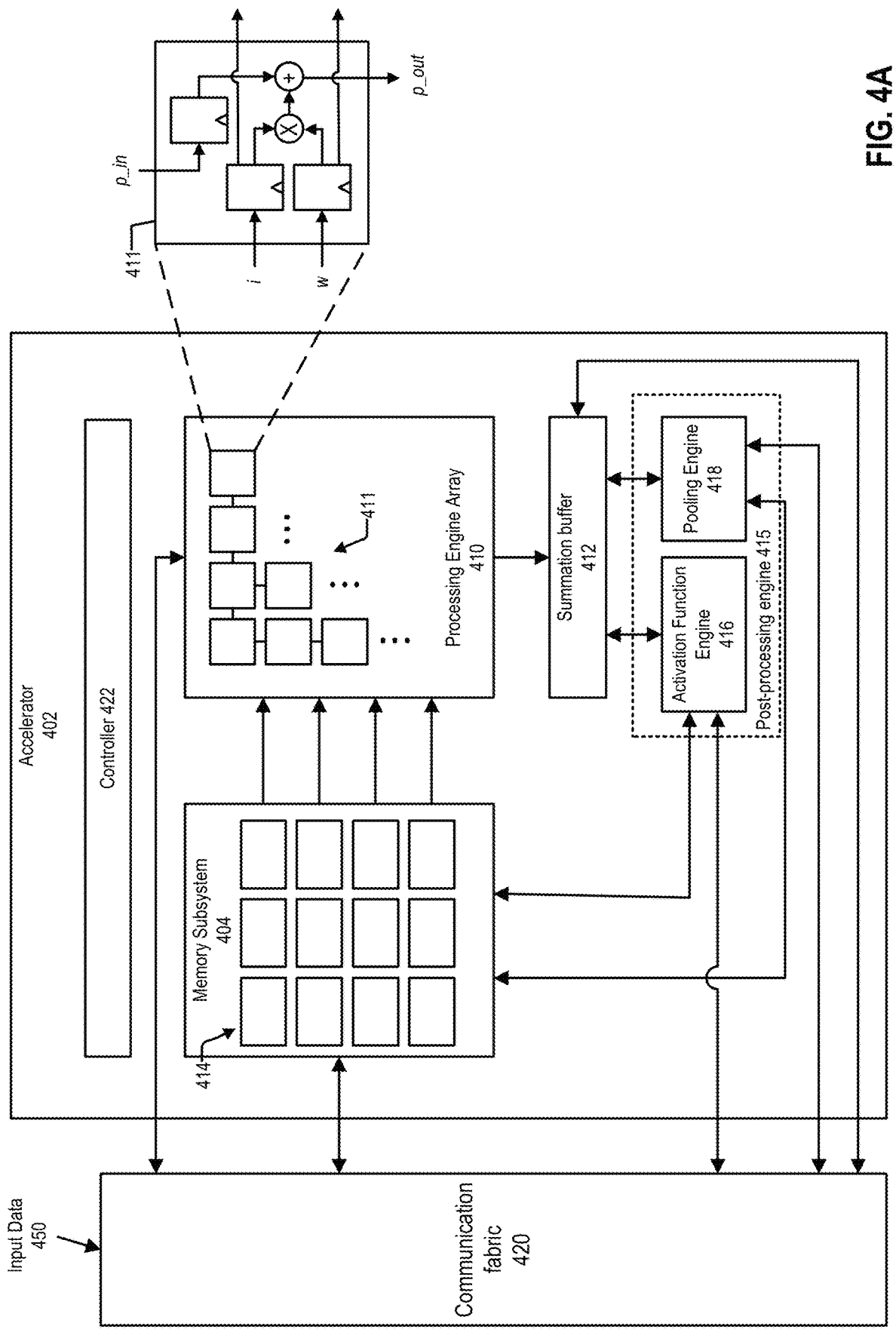
FIGS. 4A-4D illustrate an example neural network processor and its operations, according to certain aspects of the present disclosure.

FIG. 4A is a block diagram illustrating an example of an integrated circuit device that can be configured to perform various types of neural network operations. The example of FIG. 4A illustrates an accelerator 402. In various examples, the accelerator 402, for a set of input data (e.g., input data 450), can execute computations using computation circuits including a processing engine array 410 and a post-processing engine 415, which includes an activation engine 416, and/or a pooling engine 418. In some examples, the example accelerator 402 may be an integrated circuit component of a processor, such as a neural network processor. The processor may have other integrated circuit components, including additional accelerator engines. Accelerator 402 may include a controller 422 to control the operations of computation circuits including processing engine array 410 and post-processing engine 415.

In various implementations, the memory subsystem 404 can include multiple memory banks 414. In these implementations, each memory bank 414 can be independently accessible, meaning that the read of one memory bank is not dependent on the read of another memory bank. Similarly, writing to one memory bank does not affect or limit writing to a different memory bank. In some cases, each memory bank can be read and written at the same time.

Various techniques can be used to have independently accessible memory banks 414. For example, each memory bank can be a physically separate memory component that has an address space that is separate and independent of the address spaces of each other memory bank. In this example, each memory bank may have at least one read channel and may have at least one separate write channel that can be used at the same time. In these examples, the memory subsystem 404 can permit simultaneous access to the read or write channels of multiple memory banks. As another example, the memory subsystem 404 can include arbitration logic such that arbitration between, for example, the outputs of multiple memory banks 414 can result in more than one memory bank's output being used. In these and other examples, though globally managed by the memory subsystem 404, each memory bank can be operated independently of any other.

Having the memory banks 414 be independently accessible can increase the efficiency of the accelerator 402. For example, values can be simultaneously read and provided to each row of the processing engine array 410, so that the entire processing engine array 410 can be in use in one clock cycle. As another example, the memory banks 414 can be read at the same time that results computed by the processing engine array 410 are written to the memory subsystem 404. In contrast, a single memory may be able to service only one read or write at a time. With a single memory, multiple clock cycles can be required, for example, to read input data for each row of the processing engine array 410 before the processing engine array 410 can be started.

In various implementations, the memory subsystem 404 can be configured to simultaneously service multiple clients, including the processing engine array 410, the activation engine 416, the pooling engine 418, and any external clients that access the memory subsystem 404 over a communication fabric 420. In some implementations, being able to service multiple clients can mean that the memory subsystem 404 has at least as many memory banks as there are clients. In some cases, each row of the processing engine array 410 can count as a separate client. In some cases, each column of the processing engine array 410 can output a result, such that each column can count as a separate write client. In some cases, output from the processing engine array 410 can be written into the memory banks 414 that can then subsequently provide input data for the processing engine array 410. As another example, the activation engine 416 and the pooling engine 418 can include multiple execution channels, each of which can be separate memory clients. The memory banks 414 can be implemented, for example, using static random access memory (SRAM).

In various implementations, the memory subsystem 404 can include control logic. The control logic can, for example, keep track of the address spaces of each of the memory banks 414, identify memory banks 414 to read from or write to, and/or move data between the memory banks 414. In some implementations, memory banks 414 can be hardwired to particular clients. For example, a set of memory banks 414 can be hardwired to provide values to the rows of the processing engine array 410, with one memory bank servicing each row. As another example, a set of memory banks can be hard wired to receive values from columns of the processing engine array 410, with one memory bank receiving data for each column.

The processing engine array 410 is the computation matrix of the example accelerator 402. The processing engine array 410 can, for example, execute parallel integration, convolution, correlation, and/or matrix multiplication, among other things. The processing engine array 410 includes multiple processing engines 411, arranged in rows and columns, such that results output by one processing engine 411 can be input directly into another processing engine 411. Processing engines 411 that are not on the outside edges of the processing engine array 410 thus can receive data to operate on from other processing engines 411, rather than from the memory subsystem 404.

In various examples, the processing engine array 410 can include a systolic array and use systolic execution, in which data arrives at each processing engine 411 from different directions at regular intervals. In some examples, input data can flow into the processing engine array 410 from the left and weight values can be loaded at the top. In some examples weights and input data can flow from the left and partial sums can flow from top to bottom. In these and other examples, a multiply-and-accumulate operation moves through the processing engine array 410 as a diagonal wave front, with data moving to the right and down across the array. Control signals can be input at the left at the same time as weights, and can flow across and down along with the computation.

In various implementations, the number of columns in the processing engine array 410 determines the computational capacity of the processing engine array 410, and the number of rows determines the required memory bandwidth for achieving maximum utilization of the processing engine array 410. The processing engine array 410 can have, for example, 64 columns and 428 rows, or some other number of columns and rows.

An example of a processing engine 411 is illustrated in FIG. 4 in an inset diagram. As illustrated by this example, a processing engine 411 can include a multiplier-accumulator circuit. Inputs from the left can include, for example, input data i and a weight value w, where the input data is a value taken from either a set of input data or a set of intermediate results, and the weight value is from a set of weight values that connect one layer of the neural network to the next. A set of input data can be, for example, an image being submitted for identification or object recognition, an audio clip being provided for speech recognition, a string of text for natural language processing or machine translation, or the current state of a game requiring analysis to determine a next move, among other things. In some examples, the input data and the weight value are output to the right, for input to the next processing engine 411.

In the illustrated example, an input from above can include a partial sum, p_in, provided either from another processing engine 411 or from a previous round of computation by the processing engine array 410. When starting a computation for a new set of input data, the top row of the processing engine array 410 can receive a fixed value for p_in, such as zero. As illustrated by this example, i and w are multiplied together and the result is summed with p_in to produce a new partial sum, p_out, which can be input into another processing engine 411. Various other implementations of the processing engine 411 are possible.

Outputs from the last row in the processing engine array 410 can be temporarily stored in summation buffer 412. The results can be intermediate results, which can be written to the memory banks 414 to be provided to the processing engine array 410 for additional computation. Alternatively, the results can be final results, which, once written to the memory banks 414 can be read from the memory subsystem 404 over the communication fabric 420, to be output by the system.

In some implementations, the accelerator 402 includes a post-processing engine 415, which can include an activation engine 416 and a pooling engine 418. In these implementations, the activation engine 416 can combine the results from the processing engine array 410 into one or more output activations. For example, for a convolutional neural network, convolutions from multiple channels can be summed to produce an output activation for a single channel. In other examples, accumulating results from one or more columns in the processing engine array 410 may be needed to produce an output activation for a single node in the neural network. In some examples, activation engine 416 can be bypassed.

In various examples, the activation engine 416 can include multiple separate execution channels. In these examples, the execution channels can correspond to the columns of the processing engine array 410, and can perform an operation on the outputs of a column, the result of which can be stored in the memory subsystem 404. In these examples, the activation engine 416 may be able to perform between 1 and n parallel computations, where n is equal to the number of columns in the processing engine array 410. In some cases, one or more of the computations can be performed simultaneously. Examples of computations that each execution channel can perform include exponentials, squares, square roots, identities, binary steps, bipolar steps, sigmoidals, and ramps, among other examples.

In some implementations, the accelerator 402 can include a pooling engine 418. Pooling is the combining of outputs of the columns of the processing engine array 410. Combining can include for example, computing a maximum value, a minimum value, an average value, a median value, a summation, a multiplication, or another logical or mathematical combination. In various examples, the pooling engine 418 can include multiple execution channels that can operating on values from corresponding columns of the processing engine array 410. In these examples, the pooling engine 418 may be able to perform between 1 and n parallel computations, where n is equal to the number of columns in the processing engine array 410. In various examples, execution channels of the pooling engine 418 can operate in parallel and/or simultaneously. In some examples, the pooling engine 418 can be bypassed.

Herein, the activation engine 416 and the pooling engine 418 may be referred to collectively as execution engines. The processing engine array 410 is another example of an execution engine. Another example of an execution engine is a Direct Memory Access (DMA) engine, which may be located outside the accelerator 402.

Input data 450 can arrive over the communication fabric 420. The communication fabric 420 can connect the accelerator 402 to other components of a processor, such as a DMA engine that can obtain input data 450 from an Input/Output (I/O) device, a storage drive, or a network interface. The input data 450 can be, for example one-dimensional data, such as a character string or numerical sequence, or two-dimensional data, such as an array of pixel values for an image or frequency and amplitude values over time for an audio signal. In some examples, the input data 450 can be three-dimensional, as may be the case with, for example, the situational information used by a self-driving car or virtual reality data. In some implementations, the memory subsystem 404 can include a separate buffer for the input data 450. In some implementations, the input data 450 can be stored in the memory banks 414 when the accelerator 402 receives the input data 450.

In some examples, the accelerator 402 can implement a neural network processing engine. In these examples, accelerator 402, for a set of input data 450, can execute a neural network to perform a task for which the neural network was trained. Executing a neural network on a set of input data can be referred to as inference or performing inference.

The weights for the neural network can be stored in the memory subsystem 404, along with input data 450 on which the neural network will operate. The addresses of the weights and input data 450 in memory subsystem 404 can be based on or mapped to the coordinates of the weights and input data 450 in, respectively, a weight data array and an input data array, which allows the weight and the input data to be retrieved based on addresses derived from their coordinates. The neural network can also include instructions, which can be executed by controller 422 to control the processing engine array 410 to perform various computations on the weights and the input data. The f can be generated by a compiler and can also be stored in the memory subsystem 404, in the memory banks 414 or in a separate instruction buffer. The processing engine array 410 can output intermediate results, which represent the outputs of individual layers of the neural network. In some cases, the activation engine 416 and/or pooling engine 418 may be enabled for computations called for by certain layers of the neural network. The accelerator 402 can store the intermediate results in the memory subsystem 404 for inputting into the processing engine array 410 to compute results for the next layer of the neural network. The processing engine array 410 can further output final results from a last layer of the neural network. The final results can be stored in the memory subsystem 404 and then be copied out to host processor memory or to another location.

Figure 4B:
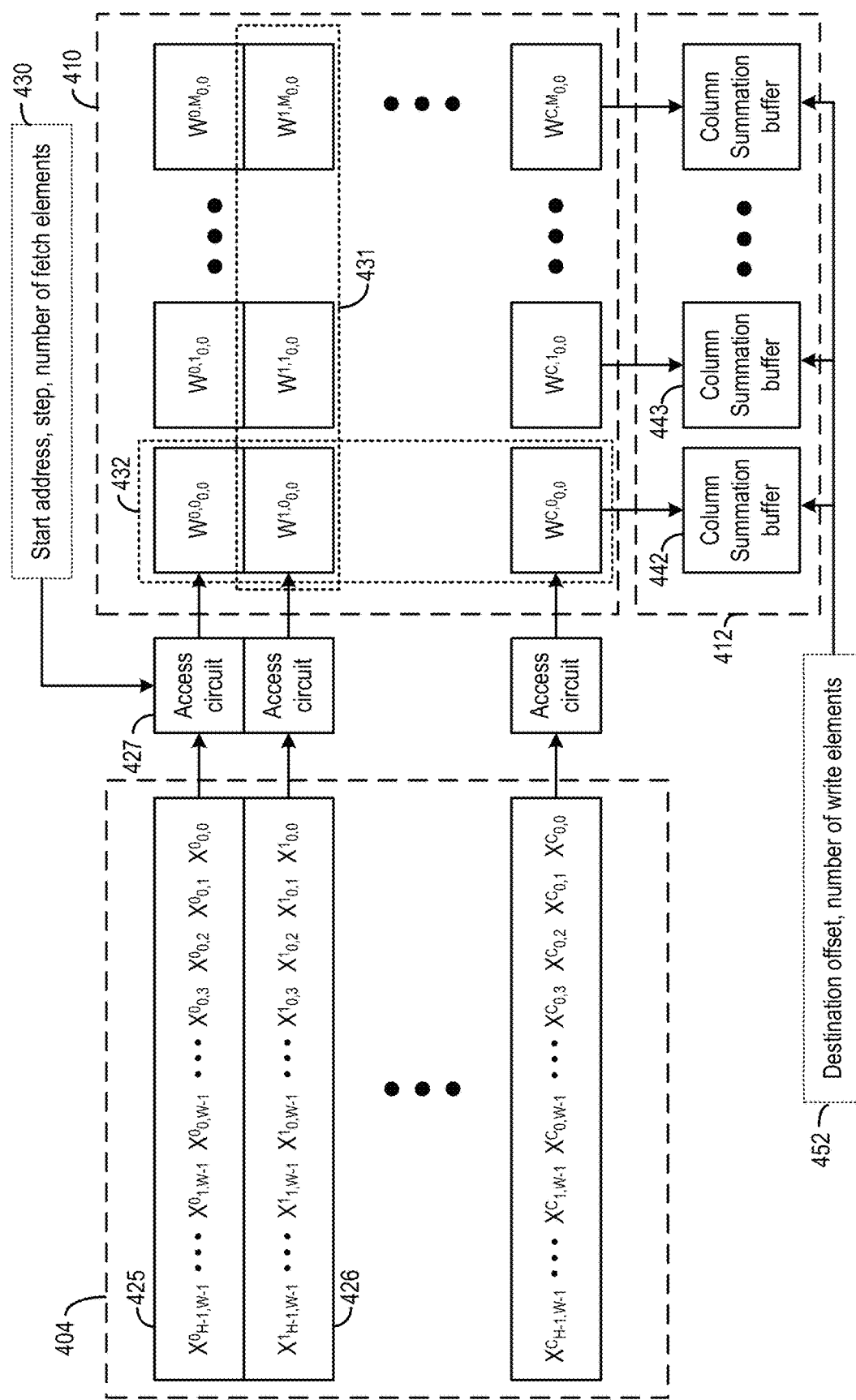
Figure 4C:
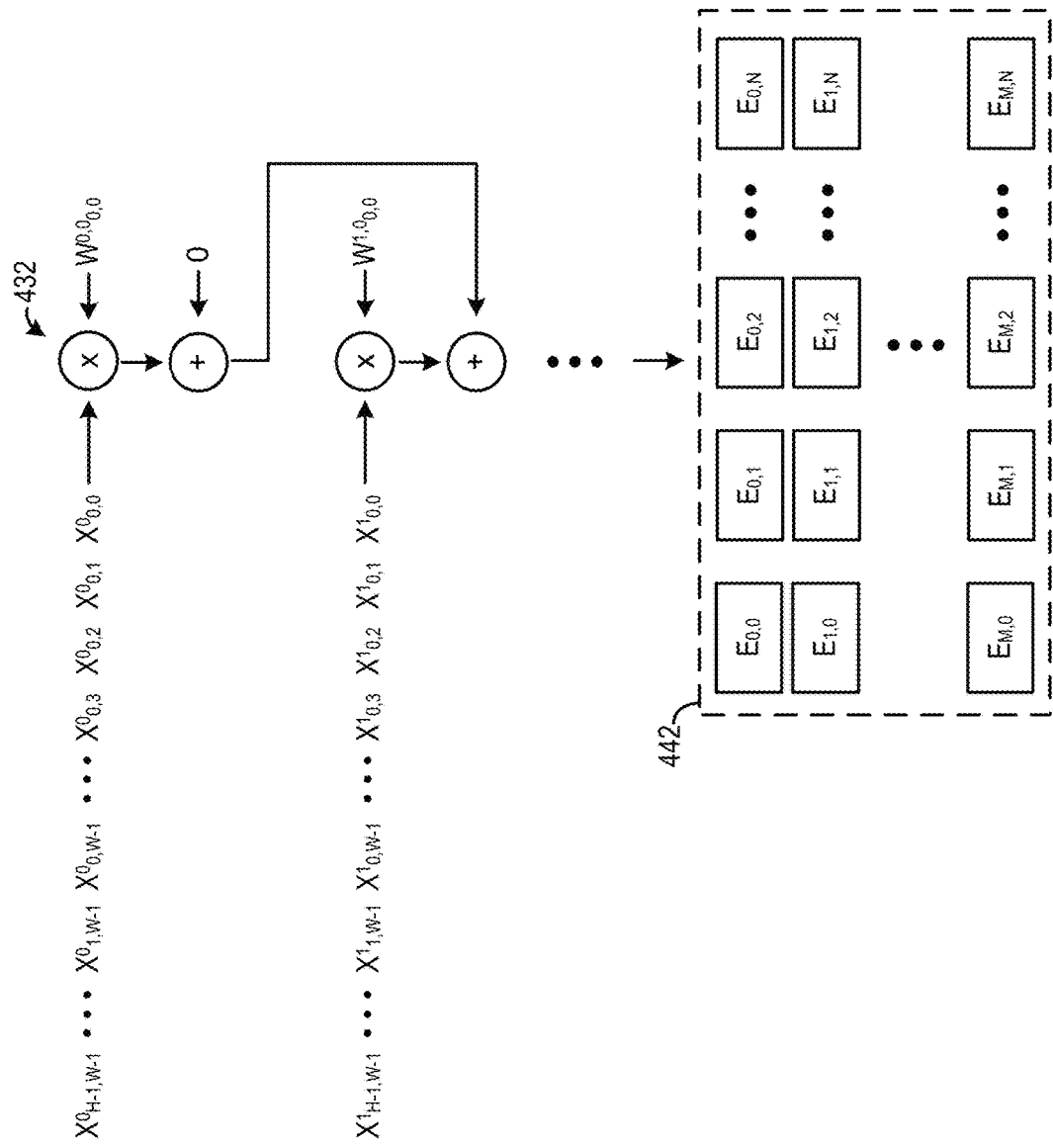

FIG. 4B and FIG. 4C illustrate examples of operations of accelerator 402. As shown in FIG. 4B, memory subsystem 404 can be organized into multiple rows, such as memory rows 425, 426, etc. In one example, the input data may be organized into three-dimensional (2D) matrices of image data with a first dimension represented by height H, a second dimension represented by width W, a third dimension represented by channel C. In the example of FIG. 4B, each memory row can store two-dimensional (2D) input data elements (across height H and weight W) of a particular input channel C. Memory subsystem 404 can also store input data of a higher dimensionality, such as 4D matrices. In one example, memory subsystem 404 can store input data belonging to different fourth dimensions at different times in each row and/or at different locations within each row. Memory subsystem 404 can fetch input data of different fourth dimensions sequentially. For example, memory subsystem 404 can first fetch three-dimensional input data of a particular fourth dimension (e.g., different channels C across different rows) to processing engine array 410, followed by input data of another fourth dimension, and so on.

A memory access circuit (e.g., memory access circuit 427), which can be part of processing engine array 410, can be controlled to fetch the input data elements to processing engine array 410 sequentially based on a set of memory fetch parameters 430 including a start address, step, and number of elements. The start address parameter can define the location of the first input data element to be read from the memory row, the step parameter can define a number of input data elements skipped between the fetched input data elements which can correspond to the stride distance (parameter D in Equations 1-3) of a convolution operation, whereas the number of fetch elements parameter can define a total number of input data elements to fetched. As the input data elements are stored in a contagious space, access circuit 427 can determine the addresses of the input data elements to be fetched and update the counter based on the step. For example, access circuit 427 can start fetching the first input data element from the start address, add an address offset based on the step to the start address to fetch the next input data element while skipping a number of input data elements, and repeat until the number of fetch elements is reached.

As to be described below, parameters 430 may include a step parameter and a number of fetch elements parameter for each dimension of the input data stored in memory subsystem 404. Memory fetch parameters 430 can be included in an instruction to processing engine array 410 to compute a set of partial sums. The instruction can be generated by a compiler and forwarded by controller 422 to processing engine array 410, which includes a decoder (not shown in FIG. 4B) to extract memory fetch parameters 430 from the instruction.

The processing engines 411 of processing engine array 410 can be organized into rows, such as row 431, and columns, such as column 432. In one example, each row of processing engines 411 can be mapped to an input channel (C) and can receive input data elements sequentially from a memory row of memory system 404 mapped to the input channel, whereas each column of processing engines 411 can be mapped to an output channel (parameter m in Equation 3). Input data elements are stored in a contiguous address space and following an order based on their coordinates in the input data array. Each processing engine 411 can store a weight data element for an input channel and an output channel the processing engine is mapped to. Each column of processing engines 411. Referring to FIG. 4A and FIG. 4B, a processing engine 411 within an engine can receive input data elements of an input channel (e.g., input data i of FIG. 4A), multiply it with the stored weight (e.g., weight data w of FIG. 4A) to generate a product, add the product to the input partial sum p_in to generate the new partial sum p_out, and pass the new partial sum p_out to the processing engine 411 below of the same column. The bottom processing engine 411 of a column can generate a partial sum representing a sum of products between the weight data elements stored in the column of processing engines 411 and the input data elements of different input channels received from memory substation 404.

In a case where memory fetch parameters 430 indicate that the starting address is at the rightmost input data element of each row, a step of one (which can indicate skipping in this example), and a certain number of input data elements are to be fetched, in a first iteration column 432 of processing engines 411 can generate a first partial sum based on the stored weight data elements and input data elements provided by memory subsystem 404 as follows:

$$\text{First partial sum} = X^0_{0,0} \times W^{0,0}_{0,0} + X^1_{0,0} \times W^{1,0}_{0,0} + \ldots + X^C_{0,0} \times W^{C,0}_{0,0} \quad \text{(Equation 6)}$$

In a second iteration, column 432 of processing engines 411 can generate a second partial sum based on the stored weight data elements and input data elements provided by memory subsystem 404 as follows:

$$\text{Second partial sum} = X^0_{0,1} \times W^{0,0}_{0,0} + X^1_{0,1} \times W^{1,0}_{0,0} + \ldots + X^C_{0,1} \times W^{C,0}_{0,0} \quad \text{(Equation 7)}$$

Each column of processing engines 411 can provide the partial sums generated in the iterations to a column summation buffer, such as column summation buffers 442, 443, etc., both of which are part of summation buffer 412. The partial sums are generated based on weight data elements at the same coordinates of different filter arrays associated with different input and output channels, and the partial sums correspond to different output data elements.

Each column summation buffer can continue accumulating the partial sums received from each column of processing engines 411 until the arithmetic operations on all the input data elements complete. The accumulated partial sums can correspond to, for example, $O_{e,f}^m$ of Equation 3. FIG. 4C illustrates example internal components of a column summation buffer, such as column summation buffers 442 and 443. As shown in FIG. 4C, a column summation buffer may include a number of entries, such as $E_{0,0}$, $E_{0,1}$, $E_{0,2}$, etc. Each entry can have coordinates mapped to coordinates of an output tile, which can represent a region of an output array. Each entry has an adder (not shown in FIG. 4C) which allows the entry to add a received partial sum to the stored partial sum to generate an accumulated partial sum. The entry can then store the accumulated partial sum. The operations at column summation buffers 442 and 443 can be controlled by a set of buffer write parameters 452 including a destination offset, a step, and a number of write elements. The destination offset parameter can indicate the entry to which the first partial sum (of the first iteration) is to be added to.

After computing the partial sums from a first set of weight data elements (same coordinates in their respective filter arrays but of different input and output channels), processing engine array 410 can load a new set of weight data elements from different coordinates and repeat the partial sums computations. The new partial sums can be added to the partial sums stored in summation buffer 412 computed from the first set of weight data elements. The computations and accumulations of the partial sums can continue for the rest of the weight data elements to generate the output data elements of the output tile.

After the data elements of the output tile are generated, summation buffer 412 can provide the data elements of the output tile to post-processing engine 415, which includes activation function engine 416 and pooling engine 418 to post-process the output data elements and write the post-processed outputs back to memory subsystem 404. The post-processing operations performed by post-processing engine 415 can be programmable. In some examples, post-processing engine 415 can be programmed to perform forward the output data elements to one of activation function engine 416 or pooling engine 418 to perform the post-processing. In some examples, post-processing engine 415 can be programmed to forward the output data elements to one of activation function engine 416 or pooling engine 418 to perform a first phase post-processing operation, write the first phase post-processed outputs back to summation buffer 412, forward the first phase post-processed outputs from summation buffer 412 to another one of activation function engine 416 or pooling engine 418 to perform a second phase post-processing operation, and then write the second phase post-processed outputs back to memory subsystem 404.

Figure 4D:
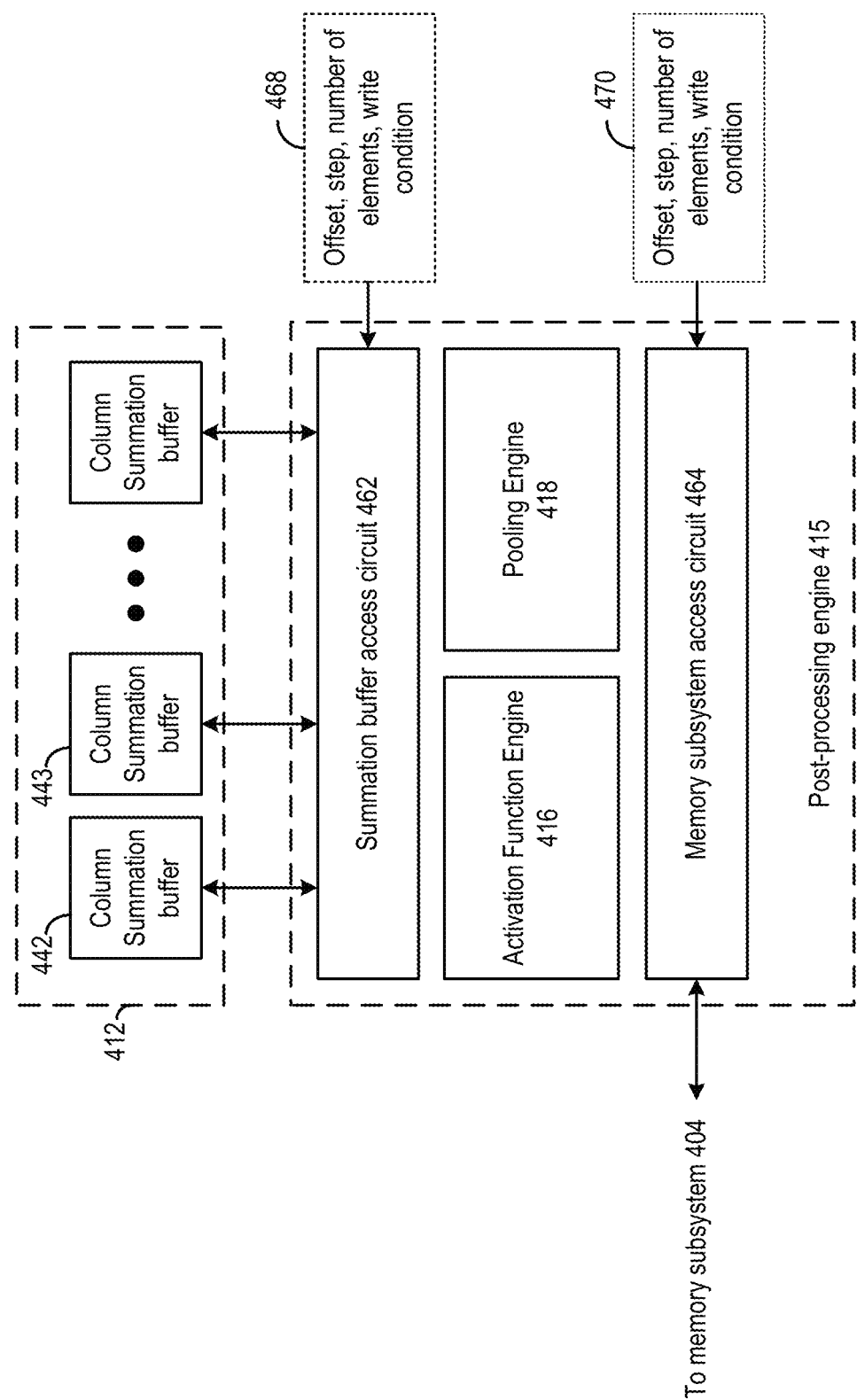

FIG. 4D illustrates example internal components of post-processing engine 415. As shown in FIG. 4D, post-processing engine 415 includes, in addition to activation function engine 416 and pooling engine 418, a summation buffer access circuit 462 and a memory subsystem access circuit 464. Summation buffer access circuit 462 provides read and write accesses of summation buffer 412 to activation function engine 416 and pooling engine 418, whereas memory subsystem access circuit 464 provides read and write accesses of memory subsystem 404 to activation function engine 416 and pooling engine 418. Each of summation buffer access circuit 462 and memory subsystem access circuit 464 is programmable by, respectively, buffer write parameters 468 and memory write parameters 470. Both parameters 468 and 470 can be generated by a compiler and forwarded by controller 422 to post-processing engine 416, which includes a decoder (not shown in FIG. 4D) to extract the parameters from the instruction.

Each of buffer write parameters 468 and memory write parameters 470 may include a start address or destination offset, a step to indicate a number of post-processed elements to be skipped between each written element, a number of elements to be written into the buffer/memory subsystem, and a condition for performing a write operation to the summation buffer/memory subsystem. The parameters can define a sequence of write operations to write the number of elements into different locations of the buffer/memory. The condition for performing a write operation may be applied to pooling engine 418 which can perform summation of output data elements of a particular dimension as part of a tensor reduction operation, and the write condition can indicate whether pooling engine 418 stores the final output of the summation operation to summation buffer 412 or memory subsystem 404, or writes the partial sums of the output data elements generated during the summation operation to summation buffer 412 or memory subsystem 404 as part of an accumulation operation. In a case where the output data elements are of multiple dimensions, buffer write parameters 468 and memory write parameters 470 may include the step size, number of elements, and write condition for each dimension for each dimension. From memory subsystem 404, the post-processed output data can be sent to communication fabric 420 and/or fetched to processing engine array 410 as input data for a subsequent neural network layer processing.

Figure 5A:
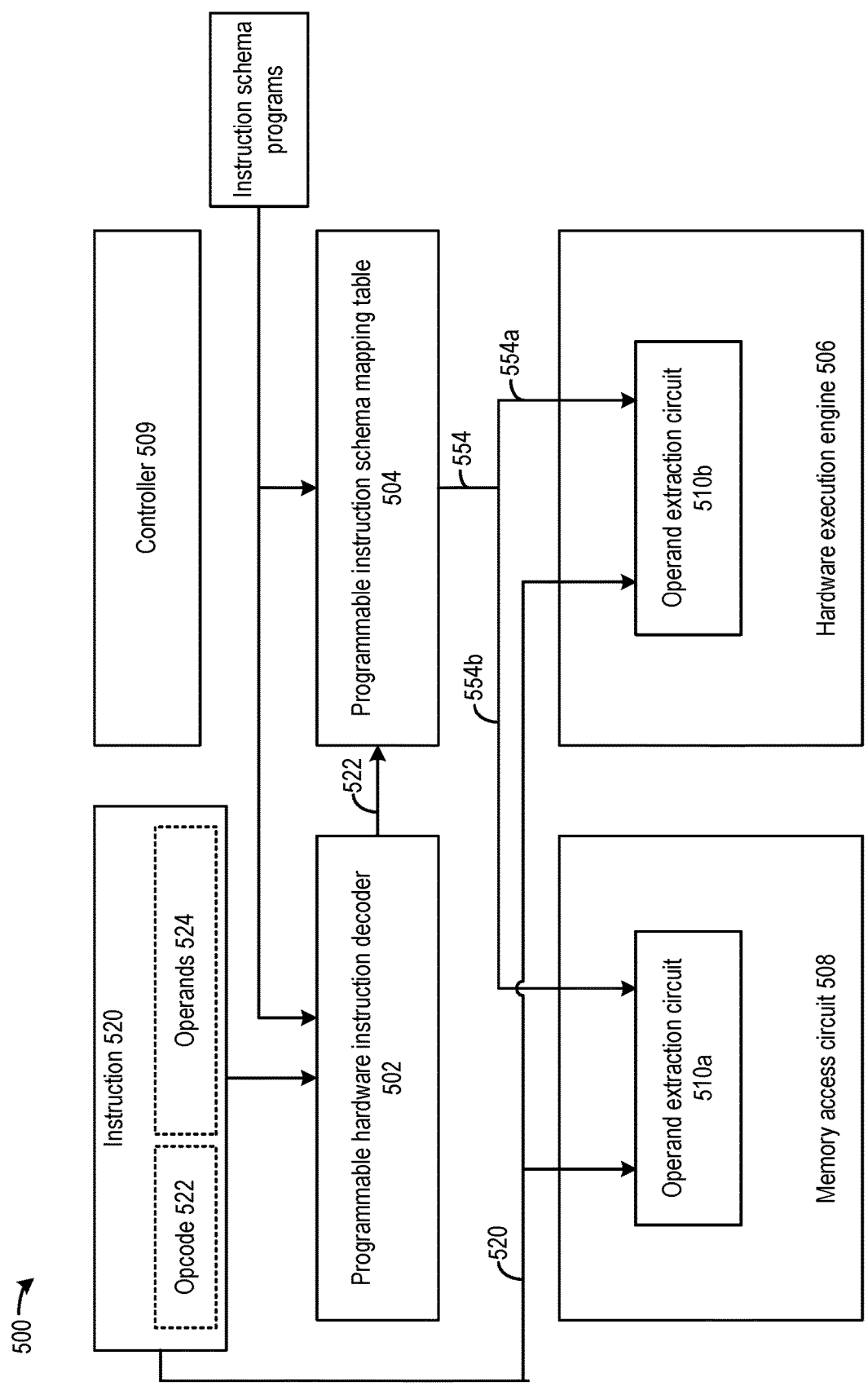
FIGS. 5A-5D illustrate examples of internal components of the neural network processor of FIGS. 4A-4D.

FIGS. 5A-FIG. 5E illustrate additional examples of internal components of a processing circuit 500 such as processing engine array 410 and post-processing engine 415. As shown in FIG. 5A, processing circuit 500 includes a programmable hardware instruction decoder 502, a programmable instruction schema mapping table 504, a hardware execution engine 506, a memory access circuit 508, and a controller 509. Hardware execution engine 506 can include, for example, processing engines 411, activation function engine 416, pooling engine 418, etc. Memory access circuit 508 can include, for example, memory access circuit 427 of FIG. 4B, summation buffer access circuit 462, memory subsystem access circuit 464, etc. Each of hardware execution engine 506 and memory access circuit 508 further includes an operand extraction circuit 510 (e.g., 510a in hardware execution engine 506, 510b in memory access circuit 508).

Processing circuit 500 can receive an instruction 520, which may include an opcode 522 which can uniquely identify instruction 520 and/or the operations to be performed by hardware execution engine 506. Instruction 520 may also include one or more operands 524 which can include configuration parameters to configure the operations at hardware execution engine 506 and memory access circuit 508. The operands may define, for example, the input data types to processing engines 411, a precision of the arithmetic operations at processing engines 411, a type of activation function to be used by activation function engine 416, a pooling operation to be performed by pooling engine 418, etc. The operands may include, for example, memory fetch parameters 430 to configure memory access circuit 427 of FIG. 4B, buffer write parameters 468 and memory write parameters 470 of FIG. 4C, etc., to configure memory access circuit 508 to perform a particular sequence of access operations at a memory (e.g., memory subsystem 414) to support the operations at hardware execution engine 506. The sequence of access operations may include, for example, a sequence of read/write operations to fetch/store a set of input data elements (e.g., from a certain destination address, skipping a number of input data elements between each data elements read or written, etc.). The sequence of memory access operations may also include, for example, performing write operations at the memory/buffer when a particular condition is satisfied, such as when a summation operation completes or whenever a partial sum is generated during the summation operation. The memory access operations can be performed to support the operations at hardware execution engine 506 associated with instruction 520. In some examples, an instruction can define both read and write access operations, if the execution of the instruction at hardware execution engine 506 requires both read and write access operations from a memory.

Figure 5B:
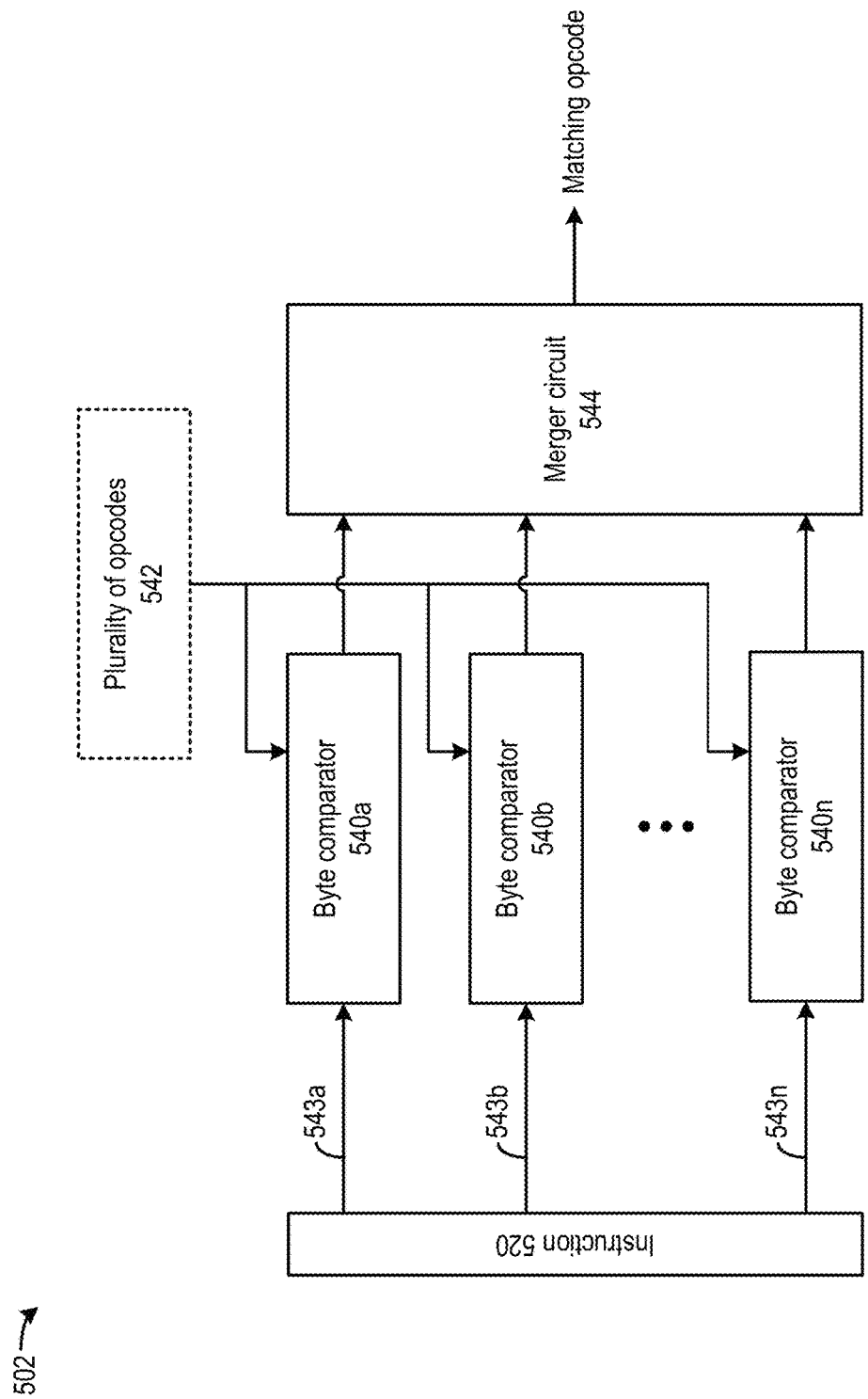
Figure 5C:
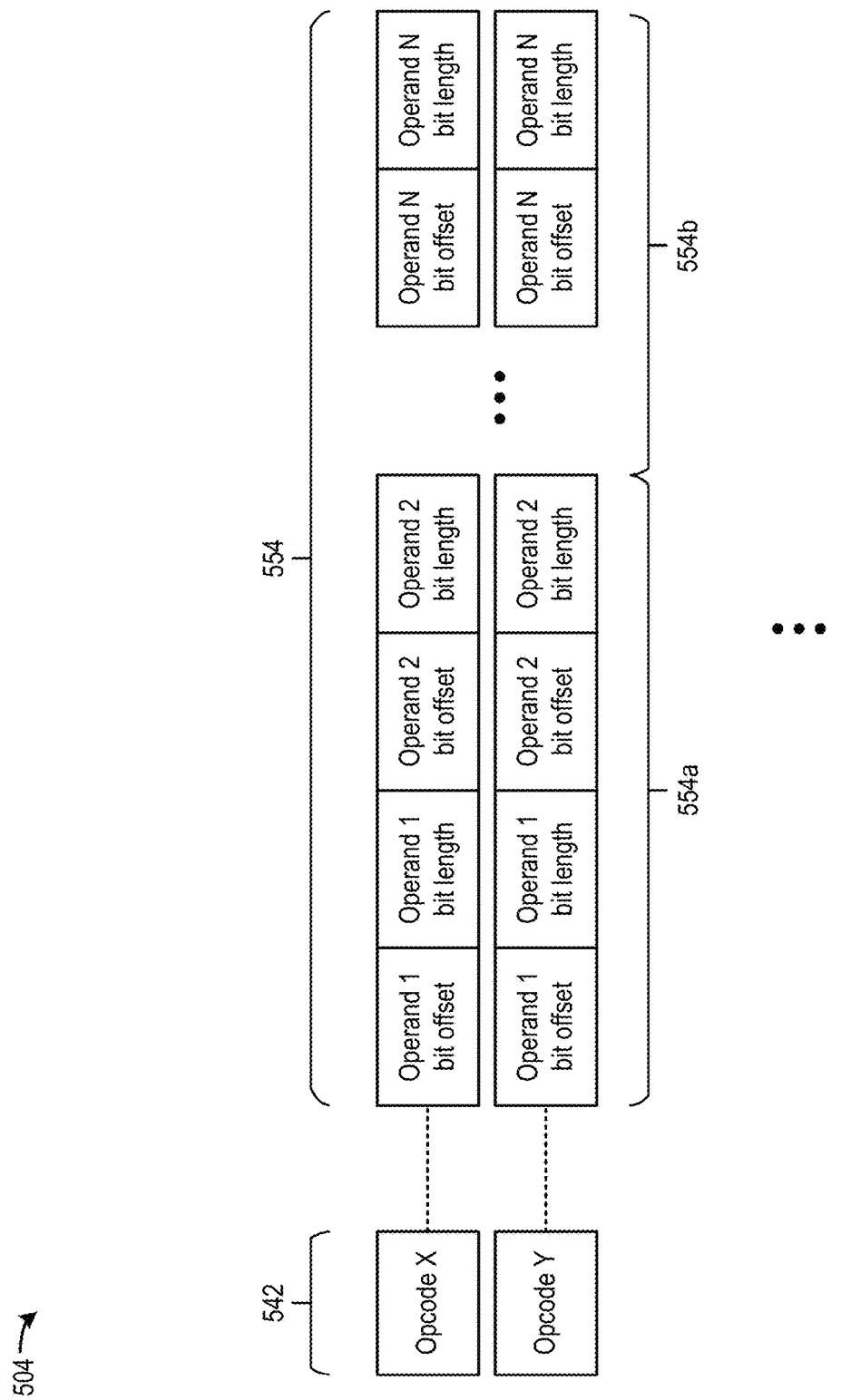

Controller 509 can control hardware instruction decoder 502 and programmable instruction schema mapping table 504 to decode instruction 520, and to provide the decoding result to memory access circuit 508 and hardware execution engine 506 to enable both to extract operands 524 from instruction 520. FIG. 5B and FIG. 5C illustrates example internal components of, respectively, hardware instruction decoder 502 and programmable instruction schema mapping table 504. Specifically, referring to FIG. 5B, hardware instruction decoder 502 can include memory devices (e.g., registers) programmed to store a plurality of opcodes 542, which can include opcode 522. Hardware instruction decoder 502 can search, in instruction 520, for an opcode that matches any of the plurality of opcodes, and output the matching opcode (e.g., opcode 522). Hardware instruction decoder 502 can include a number of byte comparators, including 540a, 540b, 540n, etc., to perform the searching. To perform the searching, instruction 520 can be segmented into a plurality of bytes 543 (e.g., 543a, 543b, 543n), with each byte fed into one of byte comparators 540 to compare with each of the plurality of opcodes 542 to search for a matching opcode. In a case where an opcode spans across one or more segmented bytes 543, subsets of bits of each of the opcode can be provided to each byte comparator to search for a matching subset of bits of the opcode. Hardware instruction decoder 502 further includes a merger circuit 544 which can include a multiplexor or other logic circuits to output the matching opcode. In a case where the opcode is completely contained in one of the segmented bytes, merger circuit 544 can select an output from one of the byte comparators as the matching opcode based on an indication from that byte comparator that the opcode is found in the byte processed by that byte comparator. Moreover, in a case where the opcode span across one or more of the segmented bytes 543, merger circuit 544 can merge the outputs from the byte comparators which indicate that subsets of bites of the opcode are found in the bytes processed by those byte comparators.

Controller 509 can control programmable hardware instruction decoder 502 to forward the matching opcode (e.g., opcode 522) to programmable instruction schema mapping table 504, which can be programmed to store a mapping between the plurality of opcodes and a plurality of definitions of bit offsets and bit lengths of operands of the instructions. FIG. 5C illustrates example internal components of programmable instruction schema mapping table 504. As shown in FIG. 5C, programmable instruction schema mapping table 504 can include memory devices (e.g., registers) programmed to store a mapping between plurality of opcodes 542 and a plurality of definitions 554. Each definition can define the bit offset and bit length of one or more operands. Some of the operands defined by a subset of definition 554 (e.g., definition 554a) can be targeted at hardware execution engine 506, whereas some of the operands defined by another subset of definition 554 (e.g., definition 554b) can be targeted at memory access circuit 508. Referring back to FIG. 5A, programmable instruction schema mapping table 504 can receive an opcode from programmable hardware instruction decoder 502 (e.g., opcode 522) and determine a definition 554 mapped to opcode 522. Controller 509 can also identify a subset of definition 554 (e.g., definition 554a) targeted at hardware execution engine 506 and another subset of definition 554 (e.g., definition 554b) targeted at memory access circuit 508. Controller 509 can then control programmable instruction schema mapping table 504 to forward definition 544b to operand extraction circuit 510a of memory access circuit 508 and definition 544a to operand extraction circuit 510b of hardware execution engine 506. Based on the received definitions, operand extraction circuit 510a and operand extraction circuit 510b can extract the respective subsets of operands 524 for memory access circuit 508 and hardware execution engine 506.

The plurality of opcodes stored in programmable hardware instruction decoder 502 and programmable instruction schema mapping table 504 can represent an instruction set currently supported by processing circuit 500 as well as accelerator 402. In some examples, the opcodes can have different bit lengths among at least a subset of the instructions. For example, some of the opcodes can have a bit length of one byte or less, whereas some of the opcodes can have a bit length of more than one byte. The bit locations and bit lengths of the operands, as well as the number of operands, can also vary among the instructions. The flexibilities in the lengths and locations of opcodes and operands allow a large number of instructions to be defined and supported by accelerator 402. As a result, a larger variety of operations can be encoded in the instructions to support different neural network topologies and/or applications, which can expand the capabilities of accelerator 402.

On the other hand, programmable hardware instruction decoder 502 and programmable instruction schema mapping table 504 need not store all the opcodes and operand definitions of the instructions supported by accelerator 402. Instead, programmable hardware instruction decoder 502 and programmable instruction schema mapping table 504 can be programmed by an instruction schema program to store only a subset of the opcodes and definitions. The subset can be used by processing circuit 500 (and accelerator 402) as an instruction set currently supported by accelerator 402. The instructions associated with the subset of opcodes and definitions can control processing circuit 500 to perform operations for a specific neural network and/or application including, for example, accessing input data of a particular dimensionality, performing a particular set of pooling operations, using a particular set of activation functions, etc. After the operations for that neural network and/or application are complete, programmable hardware instruction decoder 502 and programmable instruction schema mapping table 504 can be programmed by an instruction schema program to store another subset of the opcodes and definitions to provide another instruction set to accelerator 402. With such arrangements, the number of opcodes and definitions stored in programmable hardware instruction decoder 502 and programmable instruction schema mapping table 504 can be reduced, which not only can reduce the required storage capacity of the memory devices that store the opcodes and the definitions, but also can increase the search speed for the opcodes and definitions, to speed up the decoding operation.

Figure 5D:
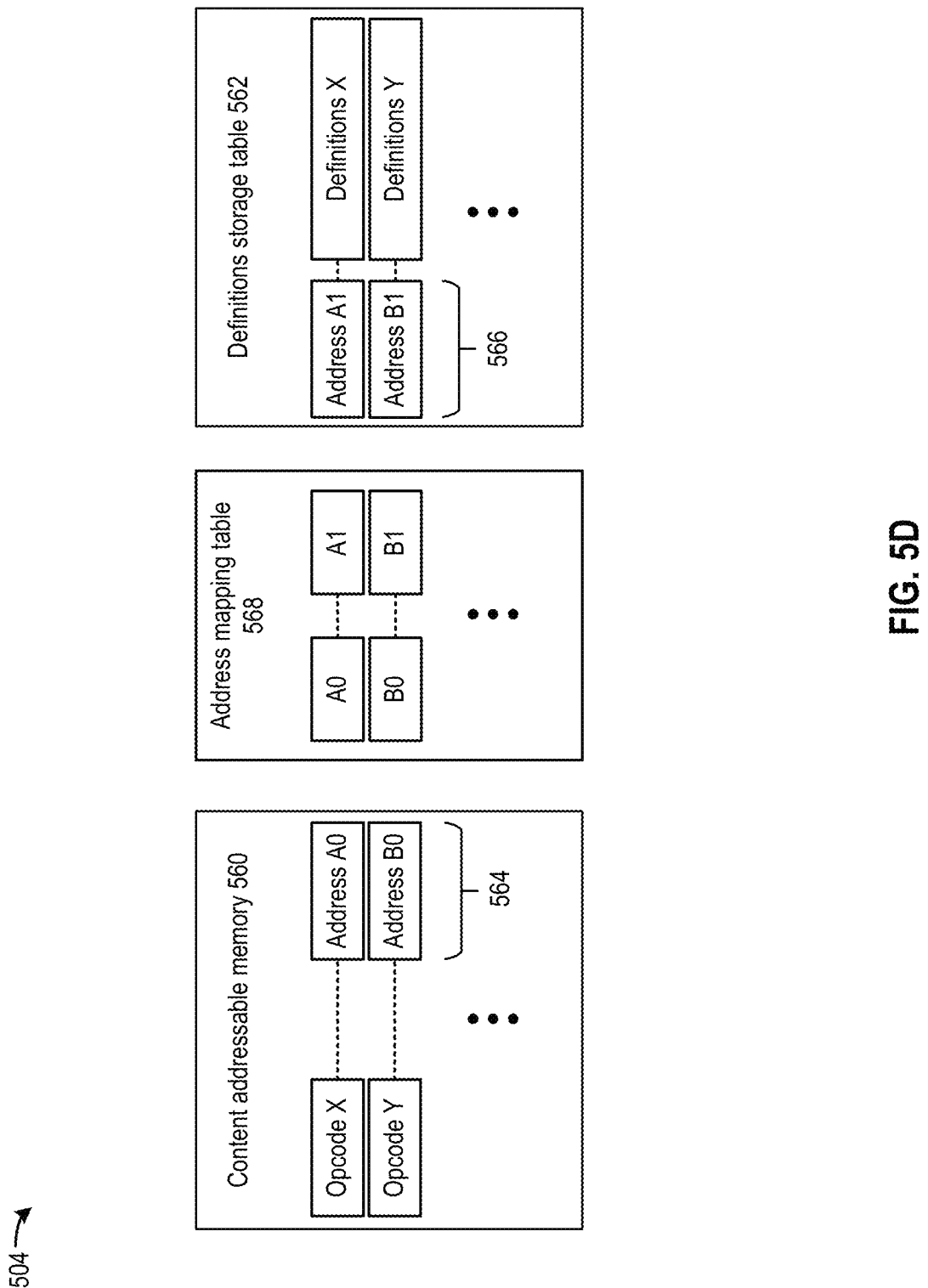

The search speed for the opcodes and definitions in programmable instruction schema mapping table 504 can be further improved by other techniques, such as the use of a content addressable memory (CAM), which can compare input search data against a table of stored data, and return the address of matching data. FIG. 5D illustrates an example of internal structure of programmable instruction schema mapping table 504. As shown in FIG. 5D, programmable instruction schema mapping table 504 may include a CAM 560. In CAM 560, each opcode can be associated with an address 564 which in turn is associated with a definition. To perform a lookup of a definition based on an opcode, CAM 560 can search for an input opcode (e.g., opcode 522). Based on the matching opcode, a corresponding address and definition can then be found. Compared with a conventional memory device that allows access only based on address, the arrangements of FIG. 5D allows opcodes and definitions to be searched for and retrieved much more quickly, which can further speed up the decoding operation.

As described above, hardware instruction decoder 502 and programmable instruction schema mapping table 504 can be programmed based on an instruction schema program to store the opcodes and definitions. Instruction schema program can be in the form of bitstreams which can be generated from an instruction schema document.

FIG. 6 illustrates an example of an instruction schema document 600 which lists an opcode ("opcode_1") for an instruction X, as well as the bit offsets and bit lengths of each operand of instruction X, such as input data type ("input_data_type"), a step parameter and a number of elements parameter for each dimension of the input data (e.g., step_x, step_y, step_z, num_element_x, num_element_y, num_element_z, etc.), etc. A bitstream of an instruction schema program which defines the bit offsets and bit lengths of the operands can then be generated from instruction schema document 600 by, for example, a compiler and based on the keywords "bit offset" and "bit length".

In some examples, instruction schema document 600 can be generated from a more human-readable instruction definition document 602, which can list the opcode and a sequential ordering of operands, as well as a type of each operand which can define the bit length of each operand. A script can be employed to generate instruction schema document 600 from instruction definition document 602 by, for example, looking up the type and order of the operands listed in instruction definition document 602 and populating the bit offset and bit length fields of the operands in instruction schema document 600. With such arrangements, edits to the instruction definition can be made in the more human-readable instruction definition document 602 to reduce the possibility of human errors, while the edits can be automatically and efficiently propagated to instruction schema document 600 with low risk of errors.

Figure 7B:
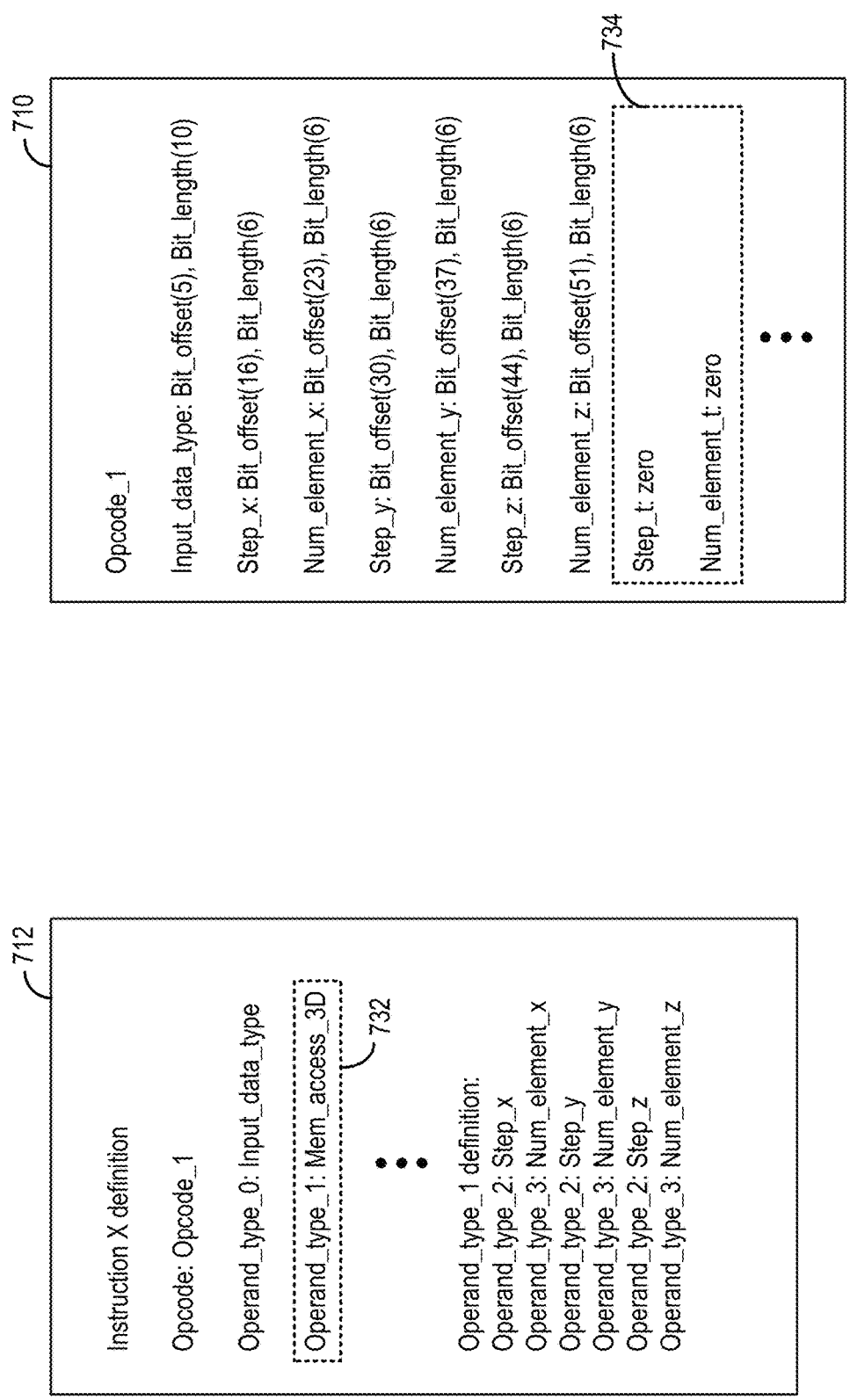
Figure 7C:
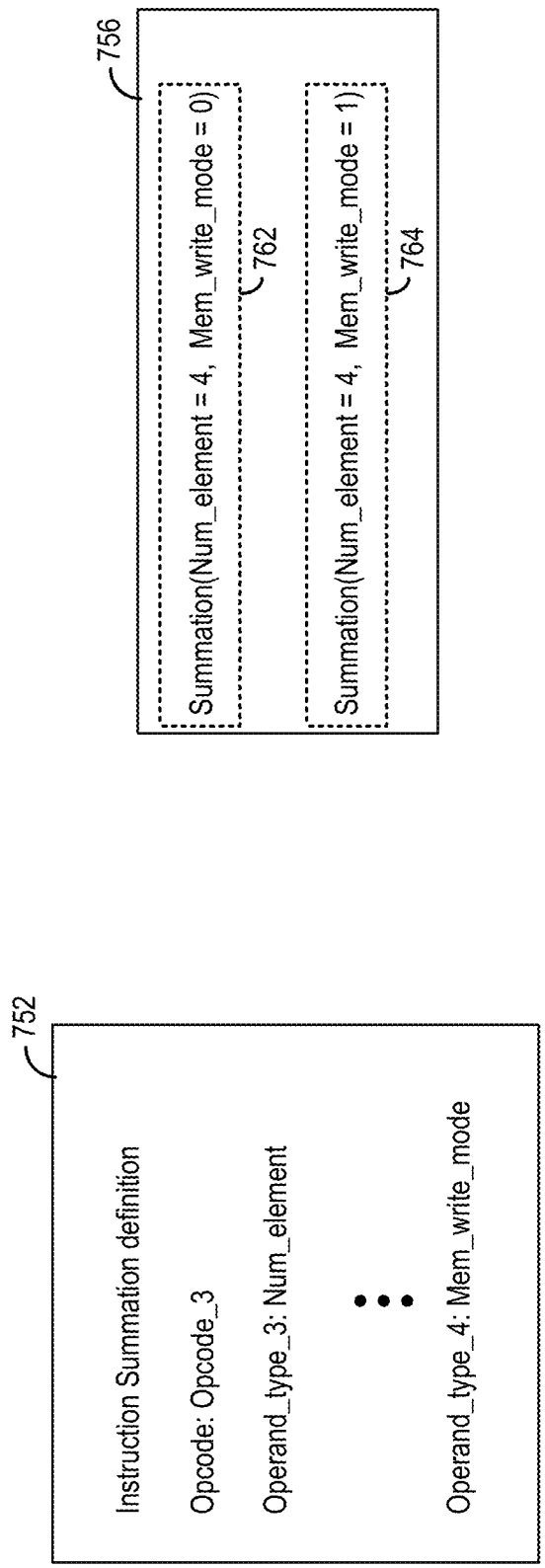

FIG. 7A-FIG. 7C illustrate additional examples of instructions for different memory access modes. As shown in FIG. 7A and FIG. 7B, two different instructions (Y and X) can include memory access operands for different dimensionality of data. FIG. 7A illustrates an instruction definition document 702 and its corresponding instruction schema document 700 for an instruction Y, whereas FIG. 7B illustrates an instruction definition document 712 and its corresponding instruction schema document 710 for instruction X of FIG. 6.

As shown in FIG. 7A, instruction Y includes an operand 722 of "Mem_access_4D" for a sequence of memory access operations of 4D data. The "Mem_access_4D" operand includes an address operand, a step operand, and a number of elements operand for each dimension of the 4D data, such as step_x and num_element_x for a first dimension, step_y and num_element_y for a second dimension, step_z and num_element_z for a third dimension, as well as step_t and num_element_t for a fourth dimension. The instruction may also include one or more addresses that define a starting location of accessing the 4D data. The address, steps, and num_element parameters can define a pattern of accessing a memory (e.g., memory subsystem 404, summation buffer 412) for each dimension. For example, "step_x" parameter can define a number of data elements to be skipped between two accessed data elements along the x dimension, whereas "num_element_x" parameter can define a number of data elements to be accessed along the x dimension. Moreover, the "step_y" parameter can define a number of data elements to be skipped between two accessed data elements along the x dimension (e.g., a row of a two-dimensional tensor), whereas "num_element_y" can define a number of data elements to be accessed along the y dimension. The "step_y" parameter can be based on the "step_x" and "num_element_x" parameters to define which data element to start a new row, whereas the "num_element_y" element can define a number of rows in the two-dimensional tensor. The "step_z" parameter can define a number of channels to be skipped between each of the two-dimensional tensors (e.g., by skipping rows of memory subsystem 404), whereas the "num_element_z" parameter can define a total number of channels (e.g., a total number of two-dimensional tensors). Finally, the "step t" parameter can define groups of three-dimensional tensors to be skipped between two groups of three-dimensional tensors being accessed (e.g., based on determining an address offset between different locations from memory subsystem 404 that store the groups of three-dimensional tensors), whereas the "num_element_t" parameter can define a total number of groups of three-dimensional tensors to be accessed. The bit offsets and bit lengths of the Mem_access_4D operands are listed in instruction schema document 700. Upon extracting the Mem_access_4D operands by operand extraction circuit 510a, memory access circuit 508 can perform a sequence of memory access operations to obtain a set of 4D data based on the step and num_element operands for each dimension.

On the other hand, in FIG. 7B, instruction X includes an operand 732 of "Mem_access_3D" as in FIG. 6 for a sequence of memory access operations for 3D data. The "Mem_access_3D" operand includes a step operand and a number of elements operand for each dimension of the 3D data, such as step_x and num_element_x for the first dimension, step_y and num_element_y for the second dimension, and step_z and num_element_z for the third dimension. Moreover, as shown in FIG. 7B, in the corresponding instruction schema document 710, the step_t and num_element_t operands 734 for the fourth dimension can be populated with zero values. Based on detecting the zero values in the bit lengths and bit offsets, controller 509 can skip sending the bit lengths and bit offsets of the step_t and num_element_t operands 734 to memory access circuit 508.

FIG. 7C illustrates an example of a summation instruction which can be supported by programmable hardware instruction decoder 502 and programmable instruction schema mapping table 504. As shown in instruction definition document 752 of FIG. 7C, a summation instruction can include an operand 754 of "mem_write_mode" which can define a condition to be satisfied for memory access circuit 508 to perform a write operation. The summation instruction can be executed by, for example, pooling engine 418 to perform a sequence of write operations for a tensor reduction operation. As shown in an instruction file 756 of FIG. 7C, summation instruction 762 has the mem_write_mode operand 754 set to a first value (e.g., a zero value) to indicate that pooling engine 418 only writes the final output of the summation operation back to memory subsystem 404, whereas summation instruction 764 has the mem_write_mode operand 754 set to a second value (e.g., a value of one) to indicate that pooling engine 418 writes each partial sum of the summation operation to memory subsystem 404 and/or to perform a write operation at each clock cycle when a partial sum is generated at pooling engine 418. As an illustrative example, assuming that pooling engine 418 receives a set of input data [1, 2, 3, 4], the execution of instruction 756 can lead to memory access circuit 508 storing only the summation output (10) in memory subsystem 404, whereas the execution of instruction 764 can lead to memory access circuit 508 storing the partial sums 1, 3 (from summation of 1 and 2), 6 (from the summation of 1, 2, and 3), and 10 in memory subsystem 404.

Figure 8A:
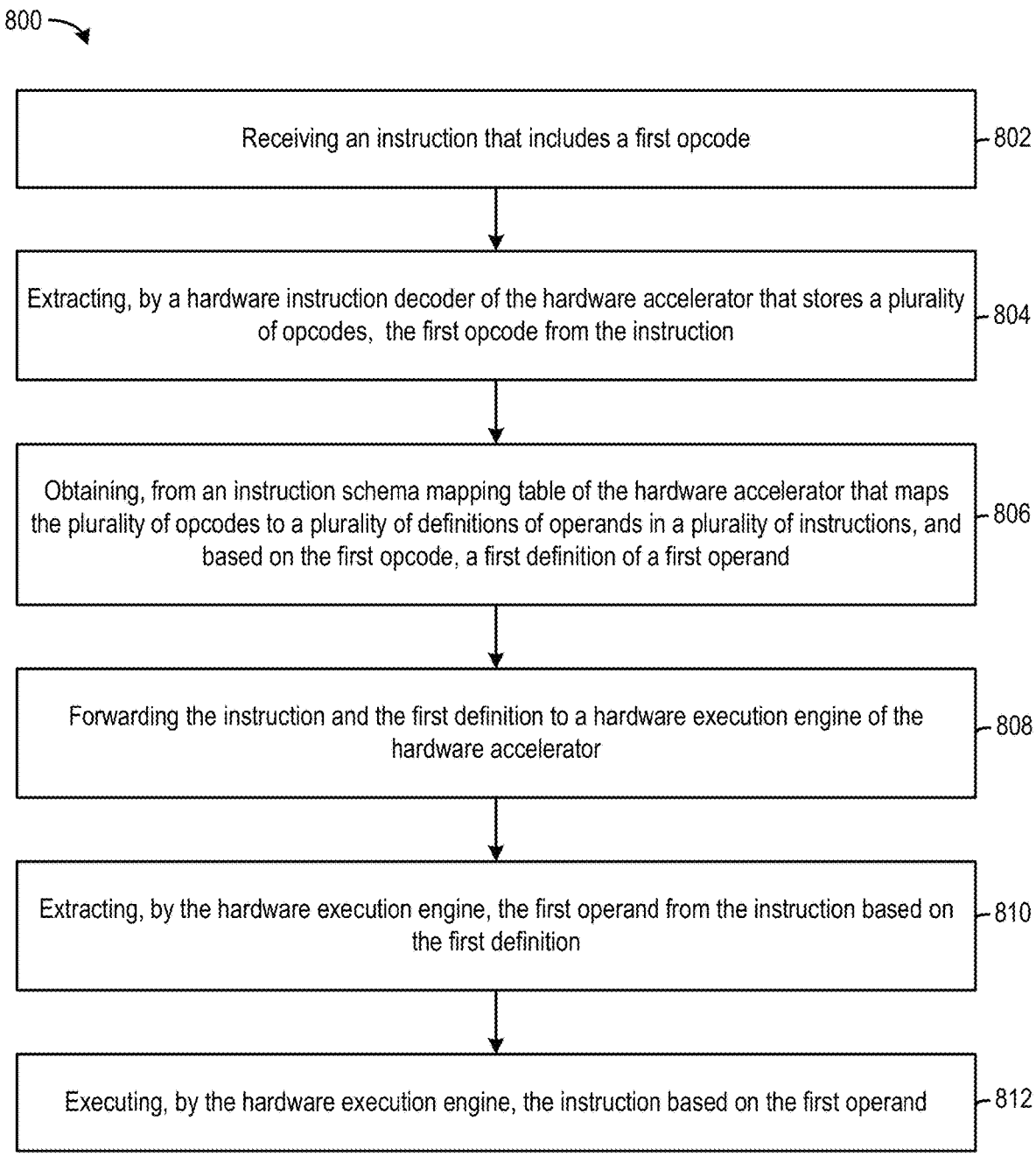
FIG. 8A and FIG. 8B illustrate example methods of performing computations at a hardware accelerator, according to certain aspects of the present disclosure.

FIG. 8A illustrates a method 800 of operating a hardware accelerator, such as accelerator 402 of FIG. 4A. Accelerator 402 may include one or more computation circuits including processing engine array 410, summation buffer 412, post-processing engine 415, etc. Each computation circuit may include components of processing circuit 500 of FIG. 5A, which can perform method 800. Processing circuit 500 includes programmable hardware instruction decoder 502, programmable instruction schema mapping table 504, hardware execution engine 506, memory access circuit 508, and controller 509. Hardware execution engine 506 can include, for example, processing engines 411, activation function engine 416, pooling engine 418, etc. Memory access circuit 508 can include, for example, memory access circuit 427 of FIG. 4B, summation buffer access circuit 462, memory subsystem access circuit 464, etc. Each of hardware execution engine 506 and memory access circuit 508 further includes an operand extraction circuit 510 (e.g., 510a in hardware execution engine 506, 510b in memory access circuit 508, etc.).

Method 800 starts with step 802, in which processing circuit 500 receives an instruction (e.g., instruction 522) that includes a first opcode (e.g., opcode 522). Opcode 522 can uniquely identify instruction 520 and/or the operations to be performed by hardware execution engine 506. Instruction 520 may also include one or more operands 524 which can include configuration parameters to configure the operations at hardware execution engine 506 and memory access circuit 508. The operands may define, for example, the input data types to processing engines 411, a precision of the arithmetic operations at processing engines 411, a type of activation function to be used by activation function engine 416, a pooling operation to be performed by pooling engine 418, etc.

In step 804, hardware instruction decoder 502 extracts the first opcode from the instruction. Hardware instruction decoder 502 can include memory devices (e.g., registers) programmed to store a plurality of opcodes 542, which can include opcode 522. Hardware instruction decoder 502 can search, in instruction 520, for an opcode that matches any of the plurality of opcodes, and output the matching opcode (e.g., opcode 522). Hardware instruction decoder 502 can include a number of byte comparators, including 540a, 540b, 540n, etc., to perform the searching. To perform the searching, instruction 520 can be segmented into a plurality of bytes 543 (e.g., 543a, 543b, 543n), with each byte fed into one of byte comparators 540 to compare with each of the plurality of opcodes 542 to search for a matching opcode. In a case where an opcode spans across one or more segmented bytes 543, subsets of bits of each of the opcode can be provided to each byte comparator to search for a matching subset of bits of the opcode. Hardware instruction decoder 502 further includes a merger circuit 544 which can include a multiplexor or other logic circuits to output the matching opcode. In a case where the opcode is completely contained in one of the segmented bytes, merger circuit 544 can select an output from one of the byte comparators as the matching opcode based on an indication from that byte comparator that the opcode is found in the byte processed by that byte comparator. Moreover, in a case where the opcode spans across one or more of the segmented bytes 543, merger circuit 544 can merge the outputs from the byte comparators which indicate that subsets of bites of the opcode are found in the bytes processed by those byte comparators.

In step 806, controller 509 obtains, from instruction schema mapping table 504 that maps the plurality of opcodes to a plurality of definitions of operands in a plurality of instructions, and based on the first opcode, a first definition of a first operand. Programmable instruction schema mapping table 504 can include memory devices (e.g., registers) programmed to store a mapping between plurality of opcodes 542 and a plurality of definitions 554. Each definition can define the bit offset and bit length of one or more operands. Some of the operands defined by a subset of definition 554 (e.g., definition 554a) can be targeted at hardware execution engine 506, whereas some of the operands defined by another subset of definition 554 (e.g., definition 554b) can be targeted at memory access circuit 508. In some examples, programmable instruction schema mapping table 504 can be implemented as a content addressable memory (CAM) to increase the speed of retrieving operand definitions based on opcodes.

Programmable hardware instruction decoder 502 and programmable instruction schema mapping table 504 need not store all the opcodes and operand definitions of the instructions supported by accelerator 402. Instead, programmable hardware instruction decoder 502 and programmable instruction schema mapping table 504 can be programmed by an instruction schema program to store only a subset of the opcodes and definitions. The subset can be used by processing circuit 500 (and accelerator 402) as an instruction set currently supported by accelerator 402. The instructions associated with the subset of opcodes and definitions can control processing circuit 500 to perform operations for a specific neural network and/or application including, for example, accessing input data of a particular dimensionality, performing a particular set of pooling operations, using a particular set of activation functions, etc. After the operations for that neural network and/or application complete, programmable hardware instruction decoder 502 and programmable instruction schema mapping table 504 can be programmed by an instruction schema program to store another instruction schema program to store another subset of the opcodes and definitions to provide another instruction set to accelerator 402. With such arrangements, the number of opcodes and definitions stored in programmable hardware instruction decoder 502 and programmable instruction schema mapping table 504 can be reduced, which not only can reduce the required storage capacity of the memory devices that store the opcodes and the definitions, but also can increase the search speed for the opcodes and definitions, to speed up the decoding operation.

In step 808, controller 509 forwards the instruction and the first definition to a hardware execution engine (e.g., one of processing engines 411, activation function engine 416, pooling engine 418), to enable hardware execution engine 506 to extract an operand from the instruction based on the first definition, and to perform an operation (e.g., arithmetic operation, activation function processing, pooling operation, etc.) based on an operand. Controller 509 can also forward the instruction and a second definition of an operand for a memory access instruction to memory access circuit 508 to perform the memory access instruction to support the operation at hardware execution engine 506.

In step 810, the hardware execution engine can extract the operand from the instruction based on the first definition, and then in step 812, execute the instruction by performing the operation based on the operand. The operation may include, for example, an arithmetic operations based on a precision specified by the operand, an activation function processing using an activation function specified by the operand, a pooling operation specified by the operand, etc.

Figure 8B:
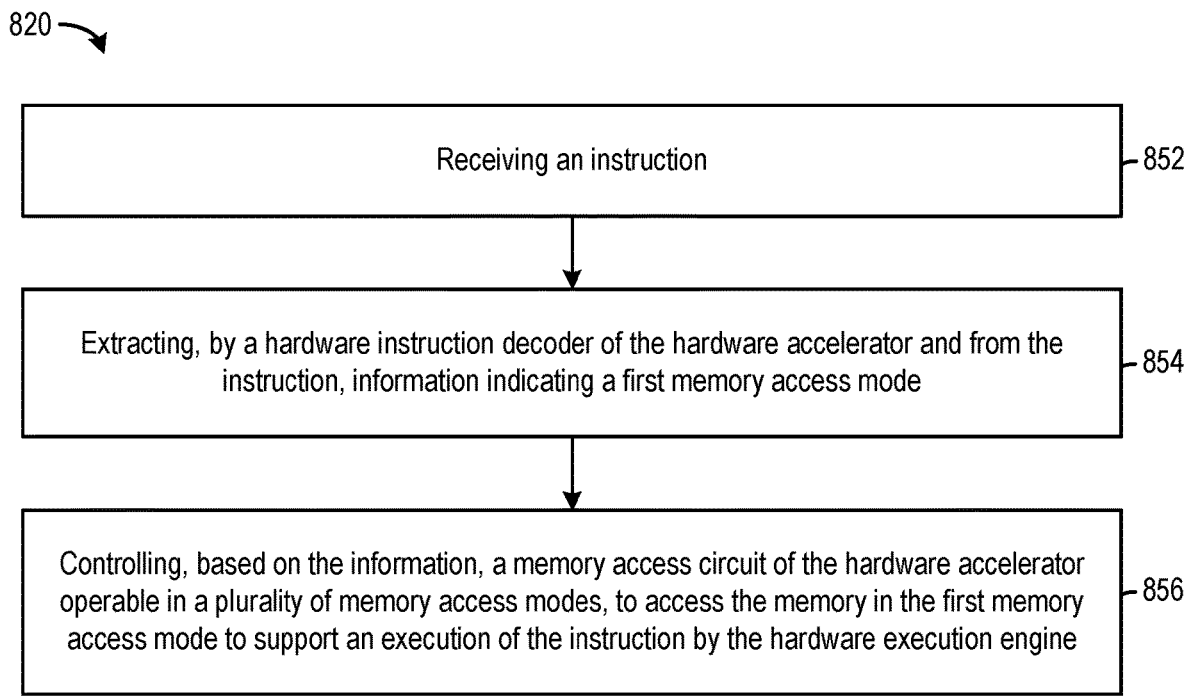

FIG. 8B illustrates a method 850 of operating a hardware accelerator, such as accelerator 402 of FIG. 4A, to perform a memory access operation at a memory. The memory can be an on-chip memory such as memory subsystem 404, summation buffer 412, etc. Method 850 can be performed by memory access circuit 508 of processing circuit 500.

Method 850 starts with step 852, in which memory access circuit 508 receives an instruction. The instruction can be forwarded by controller 509. The instruction is also decoded by hardware instruction decoder 502 to obtain an opcode, and operand definitions can also be fetched to memory access circuit 508 from instruction schema mapping table 504.

In step 854, memory access circuit 508 extracts, from the instruction, information indicating a first memory access mode of a plurality of memory access modes supported by the memory access circuit. In some examples, the plurality of memory access modes comprise accessing different dimensions of data, such as 1D, 2D, 3D, and 4D data. The instruction may also include operands/parameters for each dimension of multiple dimensions of data, such as a number of data elements to be skipped, a number of data elements to be accessed, etc. In a case where the memory access mode only accesses a subset of the multiple dimensions, the parameters of the dimensions not accessed can be zeroed out in the instruction.

In some examples, the instruction is associated with a summation operation of a plurality of data elements at the hardware execution engine. In one access mode, the memory access circuit may perform a write operation at the completion of the summation operation to store a sum of the plurality of data elements, whereas in another memory access mode the memory access circuit may perform a write operation to store each partial sum of the plurality of data elements during the summation operation.

In step 856, the memory access circuit accesses the memory in the first memory access mode to support an execution of the instruction by the hardware execution engine. For example, the memory access circuit can access memory subsystem 404 to fetch input data to a systolic array to perform computations based on the instruction, and can store output data of the systolic array at summation buffer 412.

Figure 9:
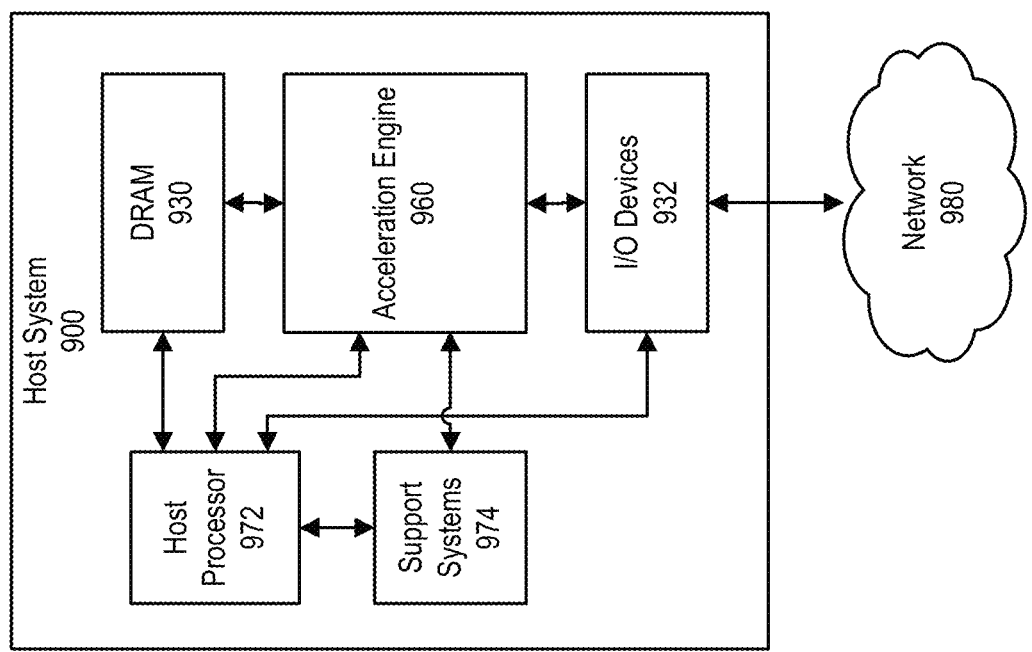
FIG. 9 includes a block diagram of a host system in which the neural network processor of FIGS. 4A-4D can be used, according to certain aspects of the present disclosure.

FIG. 9 includes a block diagram that illustrates an example of a host system 900 in which an acceleration engine 960 can be used. The acceleration engine 960 of FIG. 9 is an example of a device that can include one or more accelerators such as is illustrated in FIG. 4A. The example host system 900 of FIG. 9 includes the acceleration engine 960, a host processor 972, DRAM 930 or processor memory, I/O devices 932, and support systems 974. In various implementations, the host system 900 can include other hardware that is not illustrated here.

The host processor 972 is a general purpose integrated circuit that is capable of executing program instructions. In some examples, the host processor 972 can include multiple processing cores. A multi-core processor may include multiple processing units within the same processor. In some examples, the host system 900 can include more than one host processor 972. In some examples, the host processor 972 and the acceleration engine 960 can be one chip, such as, one or more integrated circuits within the same package.

In various examples, the host processor 972 can communicate with other components in the host system 900 over one or more communication channels. For example, the host system 900 can include a host processor bus, which the host processor 972 can use to communicate with the DRAM 930, for example. As another example, the host system 900 can include an I/O bus, such as a PCI-based bus, over which the host processor 972 can communicate with the acceleration engine 960 and/or the I/O devices 932, for example. In various examples, the host system 900 can, alternatively or additionally, include other communication channels or busses, such as serial busses, power management busses, storage device busses, and so on.

In some examples, software programs executing on the host processor 972 can receive or generate input for processing by the acceleration engine 960. In some examples, the programs can select an appropriate neural network to execute for a given input. For example, a program may be for language translation, and can select one or more neural networks capable of speech recognition and/or machine translation. In these and other examples, the programs can configure the acceleration engine 960 with the neural network to execute, and/or can select a neural network processing engine on the acceleration engine 960 that has previously been configured to execute the desired neural network. In some examples, once the acceleration engine 960 has started an inference on input data, the host processor 972 can manage the movement of data (such as weights, instructions, intermediate results, results of conditional layers, and/or final results) into or out of the acceleration engine 960.

In some examples, a software program that is using the acceleration engine 960 to conduct an inference can read the result from a conditional layer from the acceleration engine 960 and/or from a storage location, such as in DRAM 930. In these examples, the program can determine what action the neural network should take next. For example, the program can determine to terminate the inference. As another example, the program can determine to change the direction of the inference, which can be translated by lower level code and/or the neural network processor to a next layer to execute. In these and other examples, the execution flow of the neural network can be coordinated by software.

The DRAM 930 is memory that is used by the host processor 972 for storage of program code that the host processor 972 is in the process of executing, as well as values that are being operated on. In some examples, the data for a neural network (e.g., weight values, instructions, and other data) can be all or partially stored in the DRAM 930. DRAM is a common term for processor memory, and though DRAM is volatile memory, processor memory can be volatile and/or non-volatile. Though not illustrated here, the host system 900 can include other volatile and non-volatile memories for other purposes. For example, the host system 900 can include a Read-Only Memory (ROM) that stores boot code for booting the host system 900 at power on, and/or Basic Input/Output System (BIOS) code.

Though not illustrated here, the DRAM 930 can store instructions for various programs, which can be loaded into and be executed by the host processor 972. For example, the DRAM 930 can be storing instructions for an operating system, one or more data stores, one or more application programs, one or more drivers, and/or services for implementing the features disclosed herein.

The operating system can manage and orchestrate the overall operation of the host system 900, such as scheduling tasks, executing applications, and/or controller peripheral devices, among other operations. In some examples, a host system 900 may host one or more virtual machines. In these examples, each virtual machine may be configured to execute its own operating system. Examples of operating systems include Unix, Linux, Windows, Mac OS, iOS, Android, and the like. The operating system may, alternatively or additionally, be a proprietary operating system.

The data stores can include permanent or transitory data used and/or operated on by the operating system, application programs, or drivers. Examples of such data include web pages, video data, audio data, images, user data, and so on. The information in the data stores may, in some examples, be provided over the network(s) to user devices. In some cases, the data stores may additionally or alternatively include stored application programs and/or drivers. Alternatively or additionally, the data stores may store standard and/or proprietary software libraries, and/or standard and/or proprietary application user interface (API) libraries.

Information stored in the data stores may be machine-readable object code, source code, interpreted code, or intermediate code.

The drivers can include programs that provide communication between components in the host system 900. For example, some drivers can provide communication between the operating system and peripheral devices or I/O devices 932. Alternatively or additionally, some drivers may provide communication between application programs and the operating system, and/or application programs and peripheral devices accessible to the host system 900. In many cases, the drivers can include drivers that provide well-understood functionality (e.g., printer drivers, display drivers, hard disk drivers, Solid State Device drivers, etc.). In other cases, the drivers may provide proprietary or specialized functionality.

The I/O devices 932 can include hardware for connecting to user input and output devices, such as keyboards, mice, pens, tablets, voice input devices, touch input devices, displays or monitors, speakers, and printers, among other devices. The I/O devices 932 can also include storage drives and/or network interfaces for connecting to a network 980. For example, the host system 900 can use a network interface to communicate with storage devices, user terminals, other computing devices or servers, and/or other networks, among various examples.

In various examples, one or more of the I/O devices 932 can be storage devices. In these examples, the storage devices include non-volatile memory and can store program instructions and/or data. Examples of storage devices include magnetic storage, optical disks, solid state disks, flash memory, and/or tape storage, among others. The storage device can be housed in the same chassis as the host system 900 or may be in an external enclosure. A storage device can be fixed (e.g., attached by screws) or removable (e.g., having a physical release mechanism and possibly a hot-plug mechanism).

Storage devices, the DRAM 930, and any other memory component in the host system 900 are examples of computer-readable storage media. Computer-readable storage media are physical mediums that are capable of storing data in a format that can be read by a device such as the host processor 972. Computer-readable storage media can be non-transitory. Non-transitory computer-readable media can retain the data stored thereon when no power is applied to the media. Examples of non-transitory computer-readable media include ROM devices, magnetic disks, magnetic tape, optical disks, flash devices, and solid state drives, among others. As used herein, computer-readable storage media does not include computer-readable communication media.

In various examples, the data stored on computer-readable storage media can include program instructions, data structures, program modules, libraries, other software program components, and/or other data that can be transmitted within a data signal, such as a carrier wave or other transmission. The computer-readable storage media can, additionally or alternatively, include documents, images, video, audio, and other data that can be operated on or manipulated through the use of a software program.

In various examples, one or more of the I/O devices 932 can be PCI-based devices. In these examples, a PCI-based I/O device includes a PCI interface for communicating with the host system 900. The term "PCI" or "PCI-based" may be used to describe any protocol in the PCI family of bus protocols, including the original PCI standard, PCI-X, Accelerated Graphics Port (AGP), and PCI-Express (PCIe) or any other improvement or derived protocols that are based on the PCI protocols discussed herein. The PCI-based protocols are standard bus protocols for connecting devices, such as a local peripheral device, to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe.

A PCI-based device can include one or more functions. A "function" describes the hardware and/or software of an operation that may be provided by the PCI-based device. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some examples, the PCI-based device can include single-root I/O virtualization (SR-IOV). SR-IOV is an extended capability that may be included in a PCI-based device. SR-IOV allows a physical resource (e.g., a single network interface controller) to appear as multiple virtual resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

In various implementations, the support systems 974 can include hardware for coordinating the operations of the acceleration engine 960. For example, the support systems 974 can include a microprocessor that coordinates the activities of the acceleration engine 960, including moving data around on the acceleration engine 960. In this example, the microprocessor can be an integrated circuit that can execute microcode. Microcode is program code that can enable an integrated circuit to have some flexibility in the operations that the integrated circuit can execute, but because the program code uses a limited instruction set, the microprocessor may have more limited capability than the host processor 972. In some examples, the program executed by the microprocessor is stored on the hardware of microprocessor, or on a non-volatile memory chip in the host system 900. In some examples, the microprocessor and the acceleration engine 960 can be on chip, such as one integrated circuit on the same die and in the same package.

In some examples, the support systems 974 can be responsible for taking instructions from the host processor 972 when programs executing on the host processor 972 request the execution of a neural network. For example, the host processor 972 can provide the support systems 974 with a set of input data and a task that is to be performed on the set of input data. In this example, the support systems 974 can identify a neural network that can perform the task, and can program the acceleration engine 960 to execute the neural network on the set of input data. In some examples, the support systems 974 only needs to select an appropriate neural network processing engine of the neural network processor. In some examples, the support systems 974 may need to load the data for the neural network onto the acceleration engine 960 before the acceleration engine 960 can start executing the neural network. In these and other examples, the support systems 974 can further receive the output of executing the neural network, and provide the output back to the host processor 972.

In some examples, the operations of the support systems 974 can be handled by the host processor 972. In these examples, the support systems 974 may not be needed and can be omitted from the host system 900.

In various examples, the host system 900 can include a combination of host systems, processor nodes, storage subsystems, and I/O chassis that represent user devices, service provider computers or third party computers.

User devices can include computing devices to access an application (e.g., a web browser or mobile device application). In some examples, the application may be hosted, managed, and/or provided by a computing resources service or service provider. The application may enable a user to interact with the service provider computer to, for example, access web content (e.g., web pages, music, video, etc.). The user device may be a computing device such as, for example, a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device may be in communication with the service provider computer over one or more networks. Additionally, the user device may be part of the distributed system managed by, controlled by, or otherwise part of the service provider computer (e.g., a console device integrated with the service provider computers).

The host system 900 can also represent one or more service provider computers. A service provider computer may provide a native application that is configured to run on user devices, which users may interact with. The service provider computer may, in some examples, provide computing resources such as, but not limited to, client entities, low latency data storage, durable data storage, data access, management, virtualization, cloud-based software solutions, electronic content performance management, and so on. The service provider computer may also be operable to provide web hosting, databasing, computer application development and/or implementation platforms, combinations of the foregoing or the like. In some examples, the service provider computer may be provided as one or more virtual machines implemented in a hosted computing environment. The hosted computing environment can include one or more rapidly provisioned and released computing resources. These computing resources can include computing, networking and/or storage devices. A hosted computing environment may also be referred to as a cloud computing environment. The service provider computer may include one or more servers, perhaps arranged in a cluster, as a server farm, or as individual servers not associated with one another, and may host application and/or cloud-based software services. These servers may be configured as part of an integrated, distributed computing environment. In some examples, the service provider computer may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer may communicate with one or more third party computers.

Figure 10:
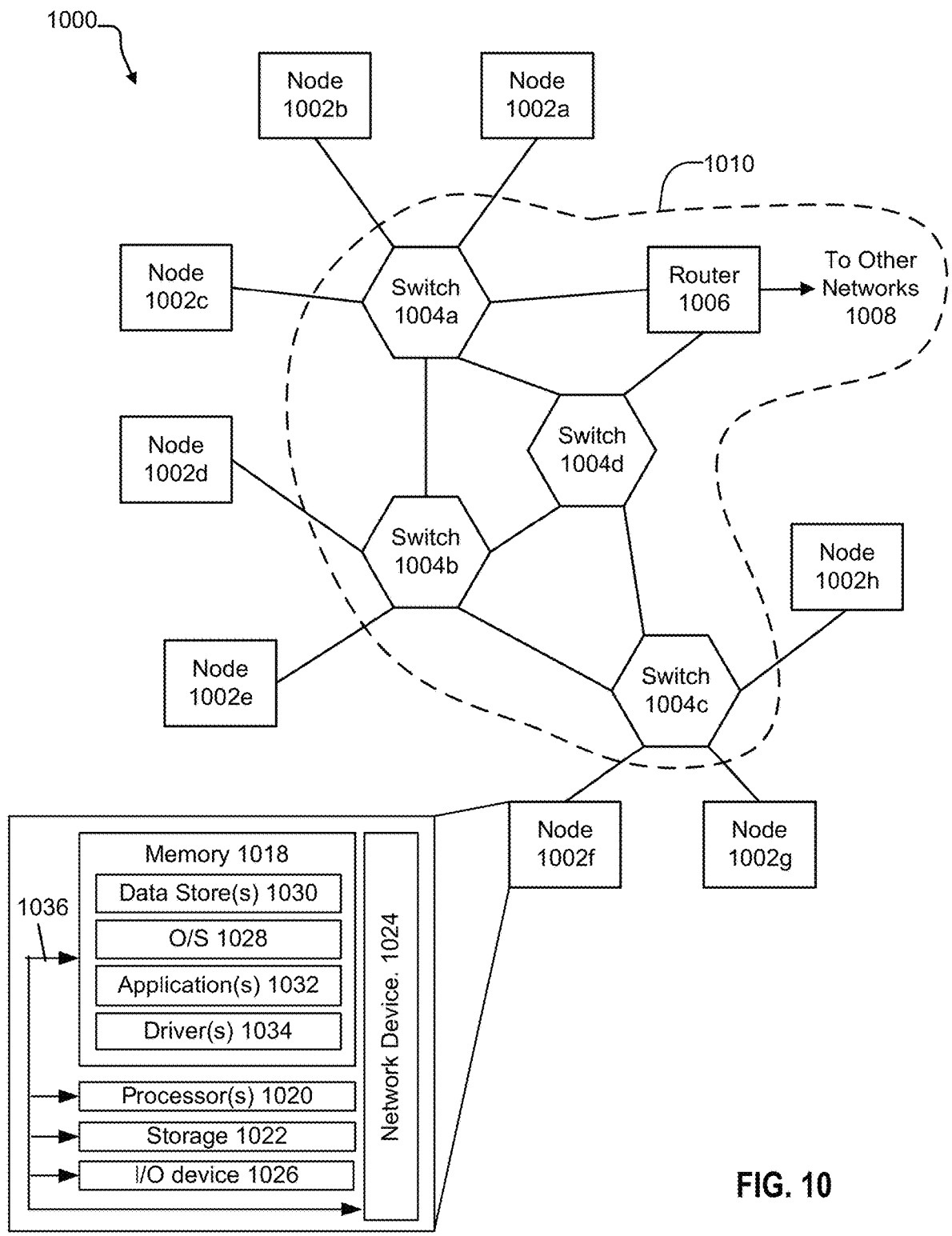
FIG. 10 includes a diagram of an example network.

FIG. 10 includes a diagram of an example network 1000, which can include one or more host systems, such as the host system illustrated in FIG. 9. For example, the example network 1000 of FIG. 10 includes multiple nodes 1002a-1002h, one or more of which can be a host system such as is illustrated in FIG. 9. Others of the nodes 1002a-1002h can be other computing devices, each of which include at least a memory for storing program instructions, a processor for executing the instructions, and a network interface for connecting to the network 1000.

In various examples, the network 1000 can be used to process data. For example, input data can be received at one of the nodes 1002a-1002h or from other networks 1008 with which the network 1000 can communicate. In this example, the input data can be directed to a node in the network 1000 that includes an acceleration engine, for the acceleration engine to operate on and produce a result. The result can then be transferred to the node or other network from which the input data was received. In various examples, input data can be accumulated from various sources, including one or more of the nodes 1002a-1002h and/or computing devices located in the other networks 1008, and the accumulated input data can be directed to one or more host systems in the network 1000. Results from the host systems can then be distributed back to the sources from which the input data was gathered.

In various examples, one or more of the nodes 1002a-1002h can be responsible for operations such as accumulating input data for host systems to operate on, keeping track of which host systems are busy and which can accept more work, determining whether the host systems are operating correctly and/or most efficiently, monitoring network security, and/or other management operations.

In the example of FIG. 10, the nodes 1002a-1002h are connected to one another using a switched architecture with point-to point links. The switched architecture includes multiple switches 1004a-1004d, which can be arranged in a multi-layered network such as a Clos network. A network device that filters and forwards packets between local area network (LAN) segments may be referred to as a switch. Switches generally operate at the data link layer (layer 2) and sometimes the network layer (layer 3) of the Open System Interconnect (OSI) Reference Model and may support several packet protocols. The switches 1004a-1004d of FIG. 10 may be connected to the nodes 1002a-1002h and provide multiple paths between any two nodes.

The network 1000 may also include one or more network devices for connection with other networks 1008, such as a router 1006. Routers use headers and forwarding tables to determine the best path for forwarding the packets, and use protocols such as internet control message protocol (ICMP) to communicate with each other and configure the best route between any two devices. The router 1006 of FIG. 10 can be used to connect to other networks 1008 such as subnets, LANs, wide area networks (WANs), and/or the Internet.

In some examples, network 1000 may include any one or a combination of many different types of networks, such as cable networks, the Internet, wireless networks, cellular networks and other private and/or public networks. The interconnected switches 1004a-1004d and the router 1006, if present, may be referred to as a switch fabric 1010, a fabric, a network fabric, or simply a network. In the context of a computer network, terms "fabric" and "network" may be used interchangeably herein.

The nodes 1002a-1002h may be any combination of host systems, processor nodes, storage subsystems, and I/O chassis that represent user devices, service provider computers or third party computers.

User devices may include computing devices to access an application 1032 (e.g., a web browser or mobile device application). In some aspects, the application 1032 may be hosted, managed, and/or provided by a computing resources service or service provider. The application 1032 may allow the user(s) to interact with the service provider computer(s) to, for example, access web content (e.g., web pages, music, video, etc.). The user device(s) may be a computing device such as for example a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device(s) may be in communication with the service provider computer(s) via the other network(s) 1008. Additionally, the user device(s) may be part of the distributed system managed by, controlled by, or otherwise part of the service provider computer(s) (e.g., a console device integrated with the service provider computers).

The node(s) of FIG. 10 may also represent one or more service provider computers. One or more service provider computers may provide a native application that is configured to run on the user devices, which user(s) may interact with. The service provider computer(s) may, in some examples, provide computing resources such as, but not limited to, client entities, low latency data storage, durable data storage, data access, management, virtualization, cloud-based software solutions, electronic content performance management, and so on. The service provider computer(s) may also be operable to provide web hosting, databasing, computer application development and/or implementation platforms, combinations of the foregoing or the like to the user(s). In some examples, the service provider computer(s) may be provided as one or more virtual machines implemented in a hosted computing environment. The hosted computing environment may include one or more rapidly provisioned and released computing resources. These computing resources may include computing, networking and/or storage devices. A hosted computing environment may also be referred to as a cloud computing environment. The service provider computer(s) may include one or more servers, perhaps arranged in a cluster, as a server farm, or as individual servers not associated with one another and may host the application 1032 and/or cloud-based software services. These servers may be configured as part of an integrated, distributed computing environment. In some aspects, the service provider computer(s) may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer(s), may communicate with one or more third party computers.

In one example configuration, the node(s) 1002a-1002h may include at least one memory 1018 and one or more processing units (or processor(s) 1020). The processor(s) 1020 may be implemented in hardware, computer-executable instructions, firmware, or combinations thereof. Computer-executable instruction or firmware implementations of the processor(s) 1020 may include computer-executable or machine-executable instructions written in any suitable programming language to perform the various functions described.

In some instances, the hardware processor(s) 1020 may be a single core processor or a multi-core processor. A multi-core processor may include multiple processing units within the same processor. In some examples, the multi-core processors may share certain resources, such as buses and second or third level caches. In some instances, each core in a single or multi-core processor may also include multiple executing logical processors (or executing threads). In such a core (e.g., those with multiple logical processors), several stages of the execution pipeline and also lower level caches may also be shared.

The memory 1018 may store program instructions that are loadable and executable on the processor(s) 1020, as well as data generated during the execution of these programs. Depending on the configuration and type of the node(s) 1002a-1002h, the memory 1018 may be volatile (such as RAM) and/or non-volatile (such as ROM, flash memory, etc.). The memory 1018 may include an operating system 1028, one or more data stores 1030, one or more application programs 1032, one or more drivers 1034, and/or services for implementing the features disclosed herein.

The operating system 1028 may support nodes 1002a-1002h basic functions, such as scheduling tasks, executing applications, and/or controller peripheral devices. In some implementations, a service provider computer may host one or more virtual machines. In these implementations, each virtual machine may be configured to execute its own operating system. Examples of operating systems include Unix, Linux, Windows, Mac OS, iOS, Android, and the like. The operating system 1028 may also be a proprietary operating system.

The data stores 1030 may include permanent or transitory data used and/or operated on by the operating system 1028, application programs 1032, or drivers 1034. Examples of such data include web pages, video data, audio data, images, user data, and so on. The information in the data stores 1030 may, in some implementations, be provided over the network(s) 1008 to user devices. In some cases, the data stores 1030 may additionally or alternatively include stored application programs and/or drivers. Alternatively or additionally, the data stores 1030 may store standard and/or proprietary software libraries, and/or standard and/or proprietary application user interface (API) libraries. Information stored in the data stores 1030 may be machine-readable object code, source code, interpreted code, or intermediate code.

The drivers 1034 include programs that may provide communication between components in a node. For example, some drivers 1034 may provide communication between the operating system 1028 and additional storage 1022, network device 1024, and/or I/O device 1026. Alternatively or additionally, some drivers 1034 may provide communication between application programs 1032 and the operating system 1028, and/or application programs 1032 and peripheral devices accessible to the service provider computer. In many cases, the drivers 1034 may include drivers that provide well-understood functionality (e.g., printer drivers, display drivers, hard disk drivers, Solid State Device drivers). In other cases, the drivers 1034 may provide proprietary or specialized functionality.

The service provider computer(s) or servers may also include additional storage 1022, which may include removable storage and/or non-removable storage. The additional storage 1022 may include magnetic storage, optical disks, solid state disks, flash memory, and/or tape storage. The additional storage 1022 may be housed in the same chassis as the node(s) 1002a-1002h or may be in an external enclosure. The memory 1018 and/or additional storage 1022 and their associated computer-readable media may provide non-volatile storage of computer-readable instructions, data structures, program modules, and other data for the computing devices. In some implementations, the memory 1018 may include multiple different types of memory, such as SRAM, DRAM, or ROM.

The memory 1018 and the additional storage 1022, both removable and non-removable, are examples of computer-readable storage media. For example, computer-readable storage media may include volatile or non-volatile, removable or non-removable media implemented in a method or technology for storage of information, the information including, for example, computer-readable instructions, data structures, program modules, or other data. The memory 1018 and the additional storage 1022 are examples of computer storage media. Additional types of computer storage media that may be present in the node(s) 1002a-1002h may include, but are not limited to, PRAM, SRAM, DRAM, RAM, ROM, EEPROM, flash memory or other memory technology, CD-ROM, DVD or other optical storage, magnetic cassettes, magnetic tape, magnetic disk storage or other magnetic storage devices, solid state drives, or some other medium which can be used to store the desired information and which can be accessed by the node(s) 1002a-1002h. Computer-readable media also includes combinations of any of the above media types, including multiple units of one media type.

Alternatively or additionally, computer-readable communication media may include computer-readable instructions, program modules or other data transmitted within a data signal, such as a carrier wave or other transmission. However, as used herein, computer-readable storage media does not include computer-readable communication media.

The node(s) 1002a-1002h may also include I/O device(s) 1026, such as a keyboard, a mouse, a pen, a voice input device, a touch input device, a display, speakers, a printer, and the like. The node(s) 1002a-1002h may also include one or more communication channels 1036. A communication channel 1036 may provide a medium over which the various components of the node(s) 1002a-1002h can communicate. The communication channel or channels 1036 may take the form of a bus, a ring, a switching fabric, or a network.

The node(s) 1002a-1002h may also contain network device(s) 1024 that allow the node(s) 1002a-1002h to communicate with a stored database, another computing device or server, user terminals and/or other devices on the network(s) 1000.

In some implementations, the network device 1024 is a peripheral device, such as a PCI-based device. In these implementations, the network device 1024 includes a PCI interface for communicating with a host device. The term "PCI" or "PCI-based" may be used to describe any protocol in the PCI family of bus protocols, including the original PCI standard, PCI-X, Accelerated Graphics Port (AGP), and PCI-Express(PCIe) or any other improvement or derived protocols that are based on the PCI protocols discussed herein. The PCI-based protocols are standard bus protocols for connecting devices, such as a local peripheral device to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe. For example, the bus interface module may implement NVMe, and the network device 1024 may be connected to a computing system using a PCIe interface.

A PCI-based device may include one or more functions. A "function" describes operations that may be provided by the network device 1024. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some implementations, the network device 1024 may include single-root I/O virtualization (SR-IOV). SR-IOV is an extended capability that may be included in a PCI-based device. SR-IOV allows a physical resource (e.g., a single network interface controller) to appear as multiple resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in the preceding figures, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A hardware accelerator comprising:
   a programmable hardware instruction decoder programmed to store a plurality of opcodes;
   a programmable instruction schema mapping table implemented as a content addressable memory (CAM) and programmed to map the plurality of opcodes to a plurality of definitions of operands in a plurality of instructions;
   a hardware execution engine; and
   a controller configured to:
      receive an instruction that includes a first opcode of the plurality of opcodes;
      control the hardware instruction decoder to extract the first opcode from the instruction;
      obtain, from the instruction schema mapping table and based on the first opcode, a first definition of a first operand, wherein the first definition specifies a location and a number of bits of the first operand in the instruction, and wherein the instruction schema mapping table is separate from the hardware instruction decoder; and
      forward the instruction and the first definition to the hardware execution engine to control the hardware execution engine to:
         extract the first operand from the instruction based on the first definition, and
         execute the instruction based on the first operand.

2. The hardware accelerator of claim 1, wherein the hardware instruction decoder is programed based on an instruction schema program that specifies a location and a number of bits of the first opcode in the instruction.

3. The hardware accelerator of claim 1, wherein each of the plurality of definitions specifies a location and a number of bits of operands in the respective instruction.

4. The hardware accelerator of claim 3, wherein the instruction schema mapping table is programmable based on the instruction schema program that further specifies locations and sizes of bits of the operands in the instructions.

5. The hardware accelerator of claim 1, wherein the CAM maps the opcodes to addresses of the definitions in the CAM; and
   wherein the mapping enables the first definition to be retrieved from the CAM based on the opcode.

6. A hardware accelerator comprising:
   an instruction decoder;
   an instruction schema mapping table;
   a hardware execution engine; and
   a controller configured to:
      receive an instruction;
      extract, using the instruction decoder, an opcode from the instruction;
      obtain, from the instruction schema mapping table and based on the opcode, an instruction schema of the instruction, wherein the instruction schema specifies a location and a number of bits of an operand in the instruction, and wherein the instruction schema mapping table is separate from the instruction decoder; and
      forward the instruction and the instruction schema to the hardware execution engine to enable the hardware execution engine to extract the operand from the instruction based on the instruction schema, and to execute the instruction based on the operand.

7. The hardware accelerator of claim 6, wherein the instruction decoder is programmable based on an instruction schema program to extract bits of the opcode from either a single byte of the instruction or from multiple bytes of the instruction; and
   wherein the instruction schema program specifies a location and a size of the bits of the opcode in the instruction.

8. The hardware accelerator of claim 7, wherein the instruction schema program specifies locations and sizes of a plurality of sets of bits of the opcode in a plurality of bytes of the instruction; and wherein the instruction decoder is programmed based on the instruction schema program to extract the plurality of sets of bits of the opcode from the plurality of bytes of the instruction and to combine the plurality of sets of bits to extract the opcode.

9. The hardware accelerator of claim 7, wherein the instruction schema mapping table is programmable based on the instruction scheme program that specifies locations and sizes of bits of operands in the instructions.

10. The hardware accelerator of claim 9, wherein the instruction schema mapping table is programmable during the execution of an instruction file comprising a first instruction and a second instruction by the hardware execution engine;
   wherein the instruction schema mapping table is programmed based on a first instruction schema program to provide a first instruction schema for the first instruction to the hardware execution engine; and
   wherein the instruction schema mapping table is programmed based on a second instruction schema program to provide a second instruction schema for the second instruction to the hardware execution engine.

11. The hardware accelerator of claim 6, wherein the instruction schema mapping table is implemented using a content addressable memory (CAM) that maps the opcodes to addresses of a plurality of instruction schemas in the CAM and enables the instruction schema to be retrieved from the CAM based on the opcode.

12. The hardware accelerator of claim 6,
   wherein the operand is a first operand;
   wherein the hardware accelerator further comprises a memory access circuit;
   wherein the controller is configured to:
      obtain, from the instruction schema mapping table and based on the opcode, a first definition of the first operand and a second definition of a second operand, wherein the first definition and the second definition specify a location and a number of bits of, respectively, the first operand and the second operand in the instruction; and
      forward the instruction and the second definition to the memory access circuit to control the memory access circuit to extract the second operand from the instruction and to perform a memory access operation based on the second operand to support the execution of the instruction by the hardware execution engine.

13. The hardware accelerator of claim 12, further comprising an on-chip memory;
   wherein the hardware execution engine comprises a systolic array;
   wherein the opcode controls the systolic array to perform computations to generate intermediate outputs; and
   wherein the memory access operation fetches input data elements and weight elements from the on-chip memory to the systolic array to perform the computations.

14. The hardware accelerator of claim 13, wherein the instruction is a first instruction;
   wherein the hardware accelerator further comprises a post-processing engine; and
   wherein the controller is configured to:
      receive a second instruction;
      extract, using the instruction decoder, a second opcode from the second instruction;
      obtain, from the instruction schema mapping table and based on the second opcode, a third definition of a third operand and a fourth definition of a fourth operand, wherein the third definition and the fourth definition specify a location and a number of bits of, respectively, the third operand and the fourth operand in the second instruction;
      forward the second instruction and the third definition to the post-processing engine to enable the post-processing engine to extract the third operand from the second instruction and to perform a post-processing operation on the intermediate outputs of the systolic array based on the third operand to generate outputs; and
      forward the second instruction and the fourth definition to the memory access circuit to store the outputs at the on-chip memory.

15. The hardware accelerator of claim 13, wherein the systolic array is programmable by a first set of instructions to perform the computations for a first neural network and programmable by a second set of instructions to perform the computations for a second neural network;
   wherein the instruction schema mapping table is programmed based on a first instruction schema program to provide instruction schemas to the systolic array to control the systolic array to perform the computations for the first neural network; and
   wherein the instruction schema mapping table is programmed based on a second instruction schema program to provide instruction schemas to the systolic array to control the systolic array to perform the computations for the second neural network.

16. The hardware accelerator of claim 6, further comprising a memory access circuit;
   wherein:
      the operand is a first operand;
      the instruction schema is a first instruction schema; and
      the controller is configured to:
         obtain, from the instruction schema mapping and based on the opcode, a second instruction schema of the instruction, the second instruction schema specifying a location and a number of bits of a second operand in the instruction; and
         forward the instruction and the second instruction schema to the memory access circuit to enable the memory access circuit to extract the second operand from the instruction based on the second instruction schema, and to perform a memory access operation based on the second operand to support the execution of the instruction at the hardware execution engine based on the first operand.

17. The hardware accelerator of claim 16, wherein the second operand specifies parameters for a memory access operation of 4D data.

18. The hardware accelerator of claim 16, wherein the second operand specifies a condition to be satisfied to perform a write operation with the memory access circuit.

19. The hardware accelerator of claim 10, wherein the first instruction schema program defines a third instruction for a memory access operation of 3D data; and
   wherein the second instruction schema program defines a fourth instruction for a memory access operation of 4D data.

20. A method of operating a hardware accelerator, comprising:
- receiving an instruction that includes a first opcode;
- extracting, by a hardware instruction decoder of the hardware accelerator that stores a plurality of opcodes, the first opcode from the instruction;
- obtaining, from an instruction schema mapping table of the hardware accelerator that maps the plurality of opcodes to a plurality of definitions of operands in a plurality of instructions, and based on the first opcode, a first definition of a first operand, wherein the first definition specifies a location and a number of bits of the first operand in the instruction, and wherein the instruction schema mapping table is separate from the hardware instruction decoder;
- forwarding the instruction and the first definition to a hardware execution engine of the hardware accelerator;
- extracting, by the hardware execution engine, the first operand from the instruction based on the first definition; and
- executing, by the hardware execution engine, the instruction based on the first operand.

21. The method of claim 20, further comprising:
- programming the hardware instruction decoder based on an instruction schema program to extract bits of the opcode from either a single byte of the instruction or from multiple bytes of the instruction; and
- wherein the instruction schema program specifies a location and a size of the bits of the opcode in the instruction.

22. The method of claim 21, wherein the instruction schema program specifies locations and sizes of a plurality of sets of bits of the opcode in a plurality of bytes of the instruction; and
- wherein the hardware instruction decoder is programmed based on the instruction schema program to extract the plurality of sets of bits of the opcode from the plurality of bytes of the instruction and to combine the plurality of sets of bits to extract the opcode.

23. The method of claim 20, further comprising:
- programming the instruction schema mapping table based on the instruction schema program that further specifies locations and sizes of bits of operands in the instructions.

24. The method of claim 23, further comprising:
- programming the instruction schema mapping table during the execution of an instruction file, the instruction file comprising a first instruction and a second instruction and to be executed by the hardware execution engine;
- wherein the instruction schema mapping table is programmed based on a first instruction schema program to provide a first instruction schema for the first instruction to the hardware execution engine; and
- wherein the instruction schema mapping table is programmed based on a second instruction schema program to provide a second instruction schema for the second instruction to the hardware execution engine.

* * * * *